United States Patent [19]
Miyano et al.

[11] Patent Number: 6,154,406
[45] Date of Patent: *Nov. 28, 2000

[54] DYNAMIC RANDOM ACCESS MEMORY CAPABLE OF SIMULTANEOUSLY WRITING IDENTICAL DATA TO MEMORY CELLS

[75] Inventors: Shinji Miyano, Yokohama; Toshimasa Namekawa, Tokyo; Masaharu Wada, Yokohama, all of Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/320,553

[22] Filed: May 27, 1999

[30] Foreign Application Priority Data

May 29, 1998 [JP] Japan ................................. 10-148674

[51] Int. Cl.$^7$ ..................................................... G11C 7/00
[52] U.S. Cl. ........................ 365/220; 365/190; 365/230.06
[58] Field of Search ................................ 365/220, 230.6, 365/190, 230.03, 233

[56] References Cited

U.S. PATENT DOCUMENTS 5,740,212   4/1998   Oh et al. .................................. 375/372
5,828,617  10/1998   Knaack ..................................... 365/220

Primary Examiner—Andrew Q. Tran
Attorney, Agent, or Firm—Banner & Witcoff, Ltd.

[57] ABSTRACT

Where a first bit line pair comprises a first bit line and a second bit line, a first memory cell is located at an intersection between a selected word line and the first bit line. Where a second bit line pair comprises a third bit line and a fourth bit line, a second memory cell is located at an intersection between the selected word line and the fourth bit line. A data line pair comprises a first data line and a second data line. A first column switch comprises a first transistor connected between the first bit line and the first data line and a second transistor connected between the second bit line and the second data line. A second column switch comprises a third transistor connected between the third bit line and the first data line and a fourth transistor connected between the fourth bit line and the second data line. A column decoder turns on one of the first column switch and the second column switch in a normal-write mode, and turns on both the first column switch and the second column switch in a block-write mode. In the block-write mode, a potential of the first bit line and a potential of the fourth bit line are complementary to each other. Identical data is written to the first memory cell and the second memory cell.

34 Claims, 20 Drawing Sheets

DYNAMIC RANDOM ACCESS MEMORY CAPABLE OF SIMULTANEOUSLY WRITING IDENTICAL DATA TO MEMORY CELLS

BACKGROUND OF THE INVENTION

The present invention relates to a dynamic random access memory (DRAM) having a function of simultaneously writing identical data to two or more memory cells having different addresses.

The DRAM is used as a main memory in most of electronic devices such as computers. The DRAM used as a main memory is required to perform high-speed operations, that is, to increase a data rate at the time of data write/read, in order to execute various processes at high speed.

In particular, in electronic devices (e.g. work stations for image-processing, video cameras, etc.) designed principally for image processing, a great deal of image data needs to be processed at high speed and thus image-processing DRAMs with special functions are widely used. At present, a synchronous graphics RAM (SGRAM) and a video RAM (VRAM) are known as such image-processing DRAMS.

One of the special functions of the image-processing DRAM is to simultaneously write identical data to two or more memory cells having different addresses ("block-write function"). This function is added to the DRAM on the basis of inherent properties of image data. Specifically, data units of pixels constituting one complete screen image (or "frame") are not necessarily different from one another at random. For example, when all or part of a frame has the same color, the data units of the pixels forming all or part of the frame may be the same. In such a case, the same data is written to memory cells of different addresses in image processing. If the block-write function of the DRAM is utilized, the data rate of write data at the time of writing can be substantially increased, and the high-speed image processing or high-speed screen display can be effected.

FIG. 1 schematically shows a conventional DRAM having the block-write function.

A DRAM 100 is used as a standard memory (general-purpose memory) or a memory within a DRAM-embedded LSI.

Each of memory array blocks 101 in the DRAM 100 includes a memory cell array and peripheral circuits necessary for data write/read, such as a row decoder, a column decoder and sense amplifiers. This example is based on the presupposition that each memory array block 101 has a function of simultaneously writing/reading 32-bit data. In this case, each memory array block 101 is connected to a multiplexer 102 over 32 DQ line pairs (data buses). In this example, since the DRAM 100 has four memory array blocks 101, the number of DQ line pairs (data buses) is 128.

A select signal and a mode signal are input to a decoder 103. For example, LSB (Lowest Significant Bit)-side two bits AC0 and AC1 of n-bit column address signals AC0, . . . , ACn-1 are assigned to the select signal. The decoder 103 decodes the 2-bit select signal and outputs a decode signal for selecting one of the four memory array blocks 101. Based on the decode signal, the multiplexer 102 connects the selected memory array block 101 to an I/O circuit (e.g. a buffer) 104.

In a normal-write mode, 32-bit data is input to the selected memory array block 101 via the I/O circuit 104 and the multiplexer 102. On the other hand, in a block-write mode, a mode signal is enabled. At this time, the decoder 103 outputs a decode signal for selecting two or more, e.g. all memory array blocks 101, irrespective of the value of the two-bit select signal. Thus, in the block-write mode, 32-bit data is input to two or more selected memory array blocks 101 via the I/O circuit 104 and multiplexer 102.

By virtue of the addition of the block-write function, the above-described DRAM can have a substantially higher data rate than the memory without the block-write function at the time of data write for image processing.

Besides, the data rate at the time of data write can also be enhanced by increasing the number of bits of data which can be simultaneously written to one memory array block 101. In this case, the number of DQ line pairs naturally increases in accordance with the increase in the number of bits of data which can be simultaneously written to one memory array block 101.

Recently, in order to increase the data rate, many memories have been developed wherein the number of bits of data which can be simultaneously written/read is increased. In particular, in a DRAM-embedded LSI (an LSI wherein a DRAM and logic elements are merged into one chip) in which a DRAM is embedded in a logic LSI, the number of I(input)/O(output) lines (hereinafter referred to as "I/O number"), i.e. the number of bits of data which can be simultaneously written/read, is very large (e.g. 128 bits).

If the block-write function is added to such a DRAM with a very high I/O number, the number of DQ line pairs (data buses) in the DRAM (the I/O number×the number of blocks) becomes very large. For example, if one I/O line is added, the number of DQ line pairs (data buses) in the DRAM increases by 1×N (N=the number of blocks). Accordingly, in the DRAM having the block-write function, the area occupied by the DQ line pairs increases considerably and the chip area increases.

As has been described above, the conventional DRAM, in particular, the DRAM for image processing which has the block-write function, has the disadvantage that the chip area considerably increases due to the increase in the I/O number.

BRIEF SUMMARY OF THE INVENTION

The object of the present invention is to provide a DRAM having a circuit configuration (or layout) wherein the number of DQ line pairs (data line pairs) does not greatly increase even if the I/O number increases, and having a function of simultaneously writing identical data to two or more memory cells having different addresses.

According to the present invention, there is provided a semiconductor memory comprising: a first bit line pair comprising a first bit line and a second bit line; a first memory cell located at an intersection between a selected word line and the first bit line; a second bit line pair comprising a third bit line and a fourth bit line; a second memory cell located at an intersection between the selected word line and the fourth bit line; a data line pair comprising a first data line and a second data line; a first column switch comprising a first transistor connected between the first bit line and the first data line and a second transistor connected between the second bit line and the second data line; a second column switch comprising a third transistor connected between the third bit line and the first data line and a fourth transistor connected between the fourth bit line and the second data line; an input/output circuit connected to one end of the data line pair; and a column decoder for turning on one of the first column switch and the second column switch in a normal-write mode, and turning on both the first column switch and the second column switch in a block-write mode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

A dynamic random access memory (DRAM) according to the present invention will now be described in detail with reference to the accompanying drawings.

(1) A circuit configuration (or layout) for achieving a first object of the present invention, i.e. to prevent an excessive increase in the number of DQ line pairs (data line pairs) due to an increase in the I/O number (the I/O number), will now be described.

Figure 2:
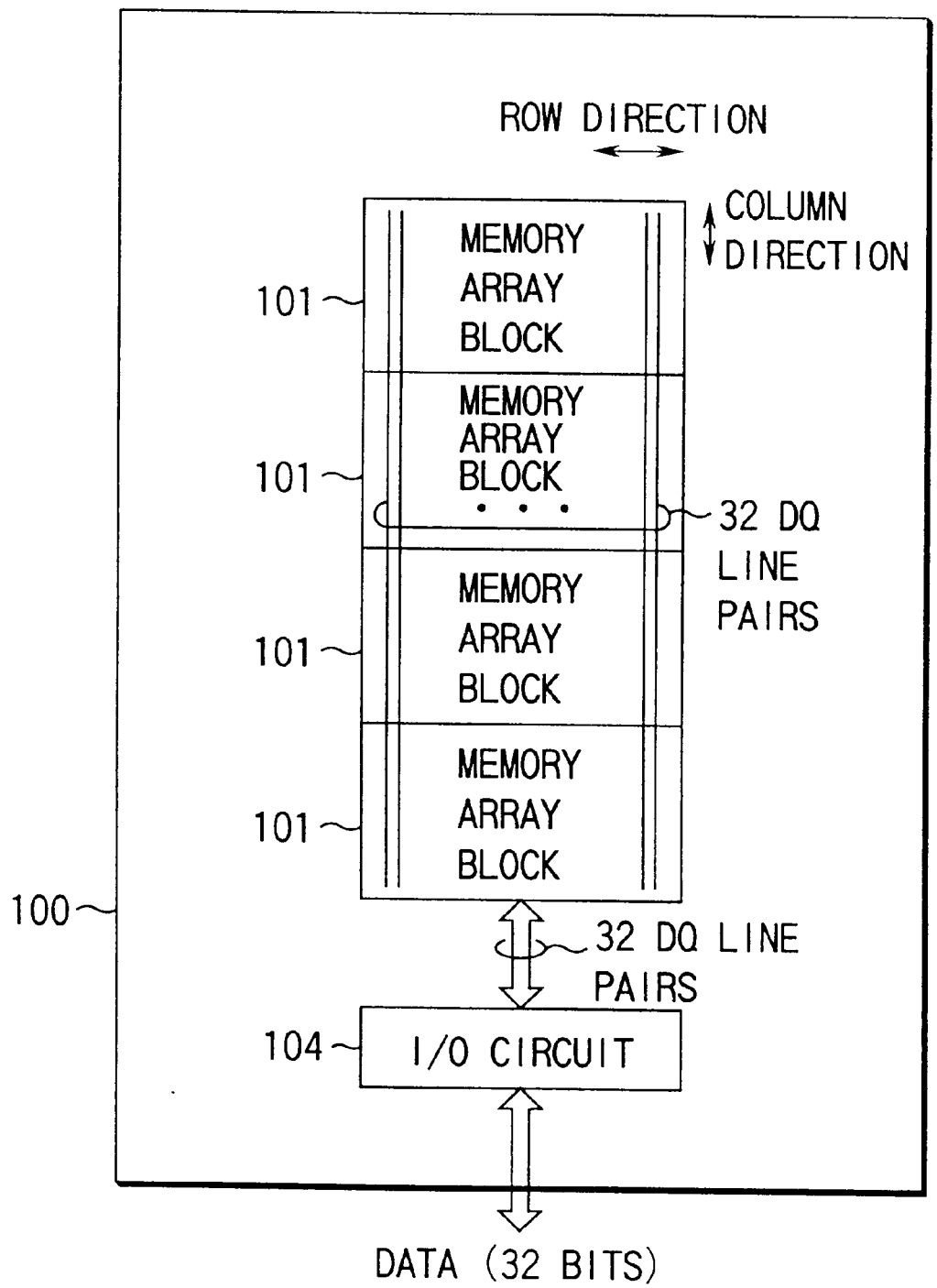
FIG. 2 schematically shows a DRAM according to the present invention.

FIG. 2 schematically shows a DRAM according to the present invention, which is designed to achieve the first object of the invention.

A DRAM 100 is used as a standard memory (general-purpose memory) or a memory in a DRAM-embedded LSI.

Figure 1:
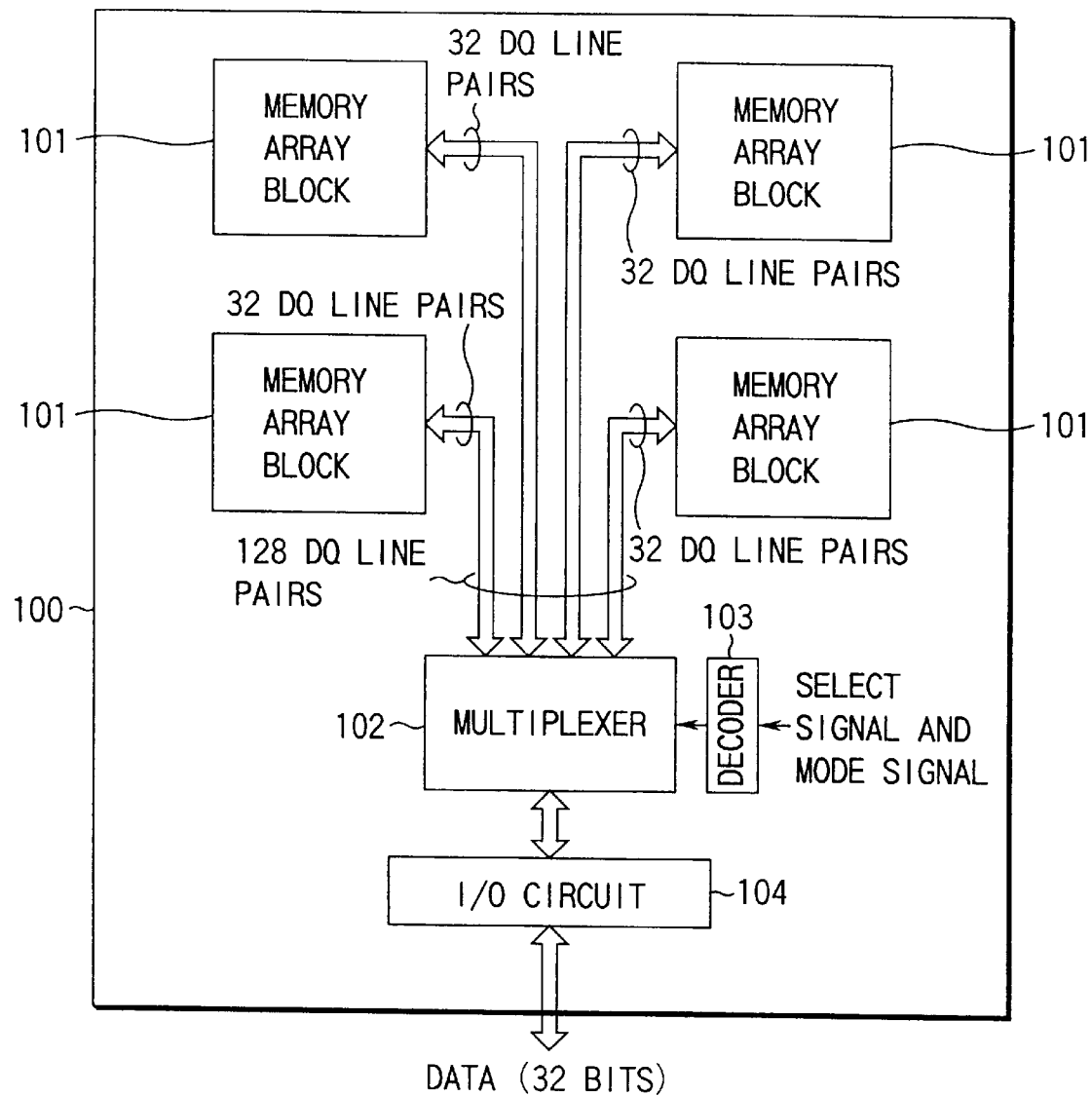
FIG. 1 schematically shows a conventional DRAM.

Each of memory array blocks 101 in the DRAM 100 includes a memory cell array and peripheral circuits necessary for data write/read, such as a row decoder, a column decoder and sense amplifiers. This embodiment, like the prior art (FIG. 1), is based on the presupposition that each memory array block 101 has a function of simultaneously writing/reading 32-bit data, that is, the I/O number is 32. In this case, the total number of DQ line pairs (data buses) is 32. Specifically, in this embodiment, the number of DQ line pairs (data buses) is always equal to the I/O number, irrespective of the number of memory array blocks 101. The reason for this is that the DQ line pairs are shared by all memory array blocks 101.

In the prior art (FIG. 1), if the I/O number increases by one, the number of DQ line pairs increases by 1×N (N=the number of blocks). Thus, the increase in the I/O number is undesirable when the chip area is to be decreased. By contrast, in the present embodiment, even if the I/O number increases by one, the number of DQ line pairs increases by only one. Therefore, the increase in the I/O number is not so undesirable for reduction in chip area.

In addition, in the present embodiment, the DQ line pairs (data buses) are arranged on the memory array blocks 101. Accordingly, the DQ line pairs do not substantially affect the chip area. Besides, one DQ line pair is connected to plural bit line pairs (to be described later in detail). Thus, the DQ line pairs can be laid out with a pitch greater than that of bit line pairs and with a width greater than that of the bit line.

In a normal-write mode, 32-bit data is input to one selected memory array block 101 via an I/O circuit 104. In addition, the 32-bit data is delivered to selected 32 bit line pairs in the selected one memory array block 101. On the other hand, in the block-write mode, 32-bit data is input to one or more memory array blocks 101 via the I/O circuit 104. In addition, the 32-bit data is delivered to selected 32×I (I=is a natural number; a maximum value of I being equal to the number of bit line pairs connected to one DQ line pair in one block) bit line pairs in the selected one or more memory array blocks 101. The selection of the blocks 101 and the selection of the bit line pairs are carried out by column address signals AC0, . . . , ACn-1.

In the above-described DRAM, the DQ line pairs shared by all memory array blocks 101 are generally called "global DQ line pairs (global data buses)". The global DQ line pairs are very suitable, for example, for designing memory cores arranged in the DRAM-embedded LSI. Specifically, the layout of global DQ line pairs is unchanged, independently of the number of memory array blocks 101.

A description will now be given of a specific circuit configuration (layout) of the DRAM shown in FIG. 2. In the following description, it is assumed that the DRAM in FIG. 2 constitutes a memory core of a DRAM-embedded LSI.

Figure 3:
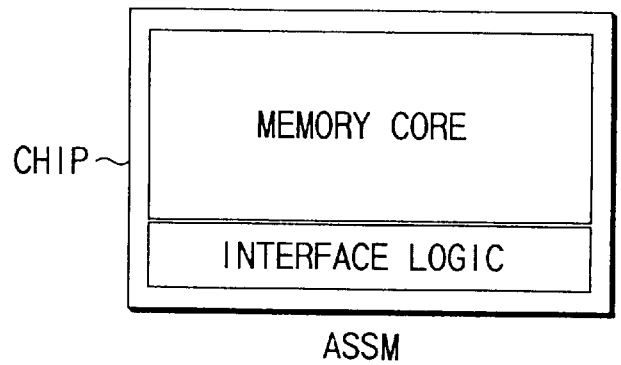
FIG. 3 shows an ASSP chip to which the DRAM of the present invention is applied.
Figure 4:
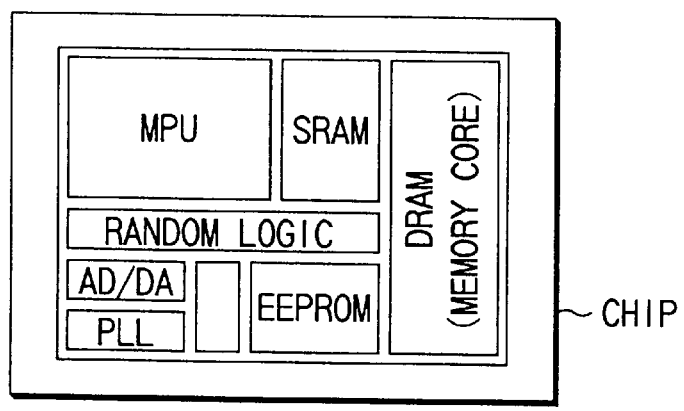
FIG. 4 shows a memory-embedded ASIC chip to which the DRAM of the present invention is applied.
Figure 5:
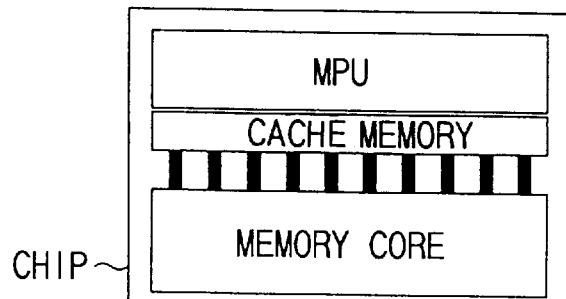
FIG. 5 shows a memory-embedded MPU chip to which the DRAM of the present invention is applied.

At first, the memory-embedded LSI will be described. Examples of conventionally known memory-embedded LSIs are: an ASSM (Application-Specific Standard Memory) shown in FIG. 3; a memory-embedded ASIC (Application-Specific Integrated Circuit) shown in FIG. 4; and a memory-embedded MPU shown in FIG. 5. These LSIs are characterized in that circuit blocks constituting memory cores are provided as IP (intellectual properties). The memory-embedded LSI (system LSI), as compared to a system wherein a standard memory (chip) and a logic LSI (chip) are combined on a board, permits an increase in the I/O number and is very excellent in performance, power consumption, a mount area, noise, etc.

Figure 6:
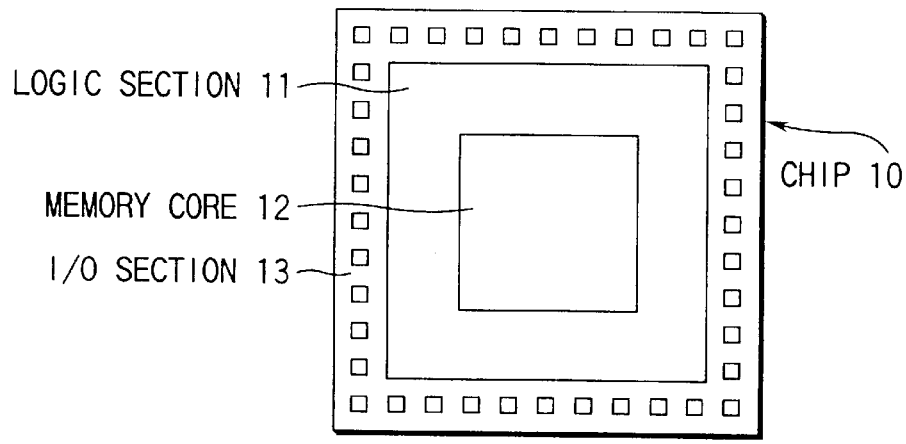
FIG. 6 shows a DRAM-embedded LSI chip to which the DRAM of the present invention is applied.
Figure 7:
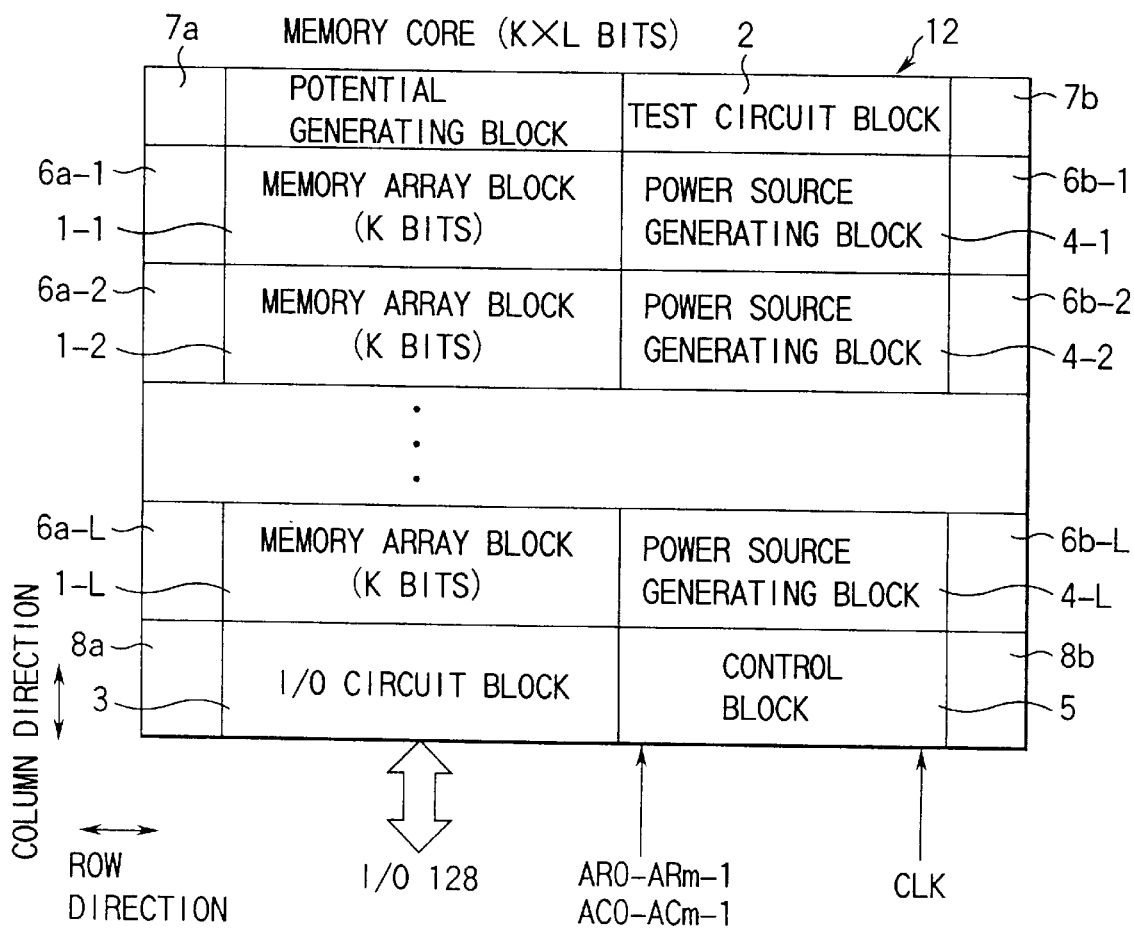
FIG. 7 shows in detail a memory core in the chip shown in FIG. 6.

FIG. 6 shows a DRAM-embedded LSI having the DRAM (memory core) shown in FIG. 2. FIG. 7 shows a floor plan of circuit blocks in the memory core.

The surface area of a chip 10 is occupied by a logic section 11, a memory core 12 and an I/O section 13. Logic circuits such as an MPU are formed on the logic section 11, and a pad is provided on the I/O section 13.

The memory core 12 comprises an L (=a natural number) number of memory array blocks 1-1, 1-2, . . . , 1-L, a test circuit block 2, an I/O circuit block 3, power source generating blocks 4-1, 4-2, . . . , 4-L, a control block 5, and power source line blocks 6a-1, 6a-2, . . . , 6a-L, 6b-1, 6b-2, . . . , 6b-L, 7a, 7b, 8a, and 8b.

Each of the memory array blocks 1-1, 1-2, . . . , 1-L includes a K- (e.g. 1 mega-) bit memory cell array, and peripheral circuits necessary for data write/read, such as a row decoder, a column decoder and sense amplifiers. Accordingly, the memory capacity of the memory core 12 is (K×L) bits.

The test circuit block 2 is a circuit block for directly testing the memory cell arrays in the memory array blocks 1-1, 1-2, . . . , 1-L, without use of the logic section.

The I/O circuit block 3 is a circuit block serving as an interface between the logic section 11 and the memory core 12. The I/O circuit block 3 comprises a buffer (or a register). The size of the buffer may be sufficiently low, compared to the size of a buffer connected to the pad. The I/O number is set at, e.g. 128.

The power source generating blocks 4-1, 4-2, . . . , 4-L generate power sources to be supplied to the memory array blocks 1-1, 1-2, . . . , 1-L. Specifically, the power sources are supplied to the peripheral circuits in the memory array blocks 1-1, 1-2, . . . , 1-L, whereby write/read operations are performed.

The control block 5 is a circuit block for controlling the operation of the memory. The control block 5 is supplied with a clock signal CLK, row address signals AR0, . . . , ARm-1, and column address signals AC0, . . . , ACm-1.

The power source line blocks 6a-1, 6a-2, . . . , 6a-L, 6b-1, 6b-2, . . . , 6b-L, 7a, 7b, 8a, and 8b are blocks provided with wires for supplying power sources to the peripheral circuits in the memory cell blocks 1-1, 1-2, . . . , i-L without a decrease in level (at low resistance).

Figure 8:
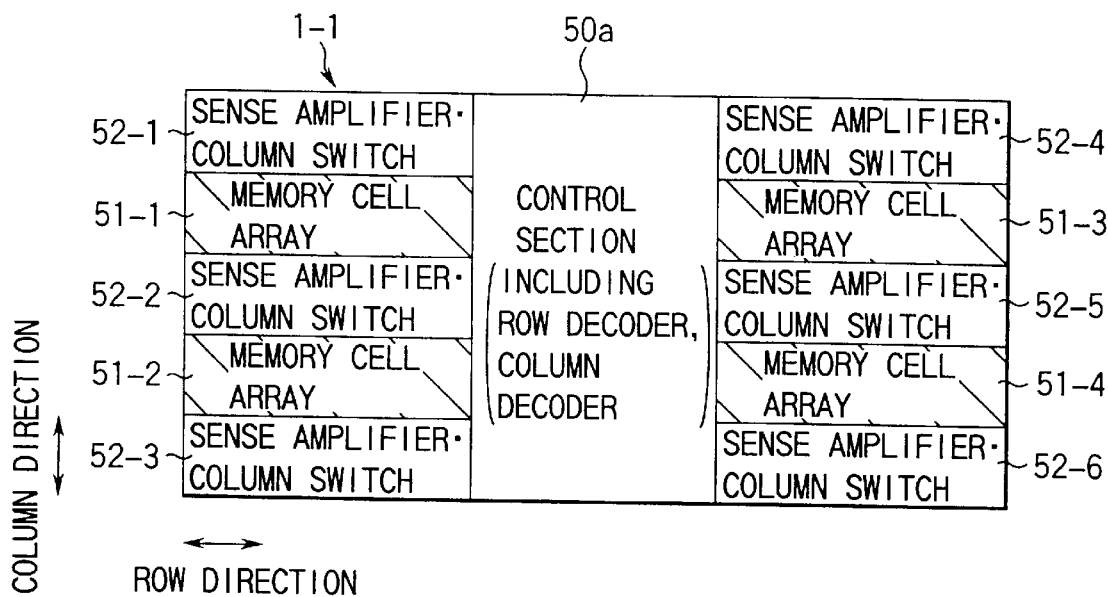
FIG. 8 shows in detail a memory array block in the memory core shown in FIG. 7.
Figure 9:
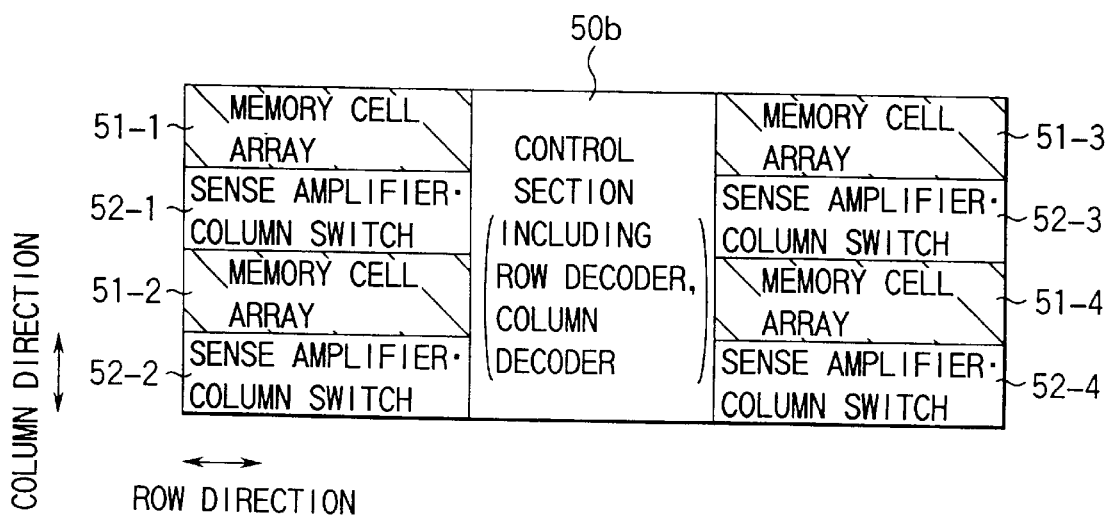
FIG. 9 shows in detail a memory array block in the memory core shown in FIG. 7.

FIG. 8 shows an example of layout of circuits within the memory array block 1-1 shown in FIG. 7, and FIG. 9 shows an example of layout of circuits within the memory array block, 102, . . . , 1-L, in FIG. 7.

The memory array block 1-1 comprises a control section 50a, memory cell arrays 51-1, 51-2, 51-3 and 51-4, and sense amplifier/column switch sections 52-1, 52-2, 52-3, 52-4, 52-5 and 52-6.

The control section 50a includes a row decoder and a column decoder. The memory cell arrays 51-1, 51-2, 51-3 and 51-4 have the same memory capacity. If the capacity of the memory array block 1-1 is 1 megabit, the capacity of each memory cell array is 256 kilobits. In this embodiment, four memory cell arrays 51-1, 51-2, 51-3 and 51-4 are arranged within the memory array block 1-1, but a different number of memory cell arrays may be arranged. The sense amplifier/column switch sections 52-1, 52-2, 52-3, 52-4, 52-5 and 52-6 are arranged on both sides of the memory cell arrays 51-1, 51-2, 51-3 and 51-4 in the column direction. In other words, the memory cell arrays 51-1, 51-2, 51-3 and 51-4 are sandwiched by the sense amplifier/column switch sections 52-1, 52-2, 52-3, 52-4, 52-5 and 52-6, respectively.

The memory array block, 1-2, . . . , 1-L, comprises a control section 50b, memory cell arrays 51-1, 51-2, 51-3 and 51-4, and sense amplifier/column switch sections 52-1, 52-2, 52-3 and 52-4.

The memory array block, 1-2, . . . , 1-L, is characteristically distinguished from the memory array block 1-1 in that the number of sense amplifier/column switch sections is smaller. The reason is that an L-number of memory array blocks 1-1, . . . , 1-L are mutually combined when the memory core is designed. Specifically, if the number of sense amplifier/column switch sections in the memory array block 1-1 is made greater than that of sense amplifier/column switch sections in the other memory array block, 1-2, . . . , 1-L, all memory cell arrays are sandwiched by the sense amplifier/column switch sections in the memory core.

Figure 10:
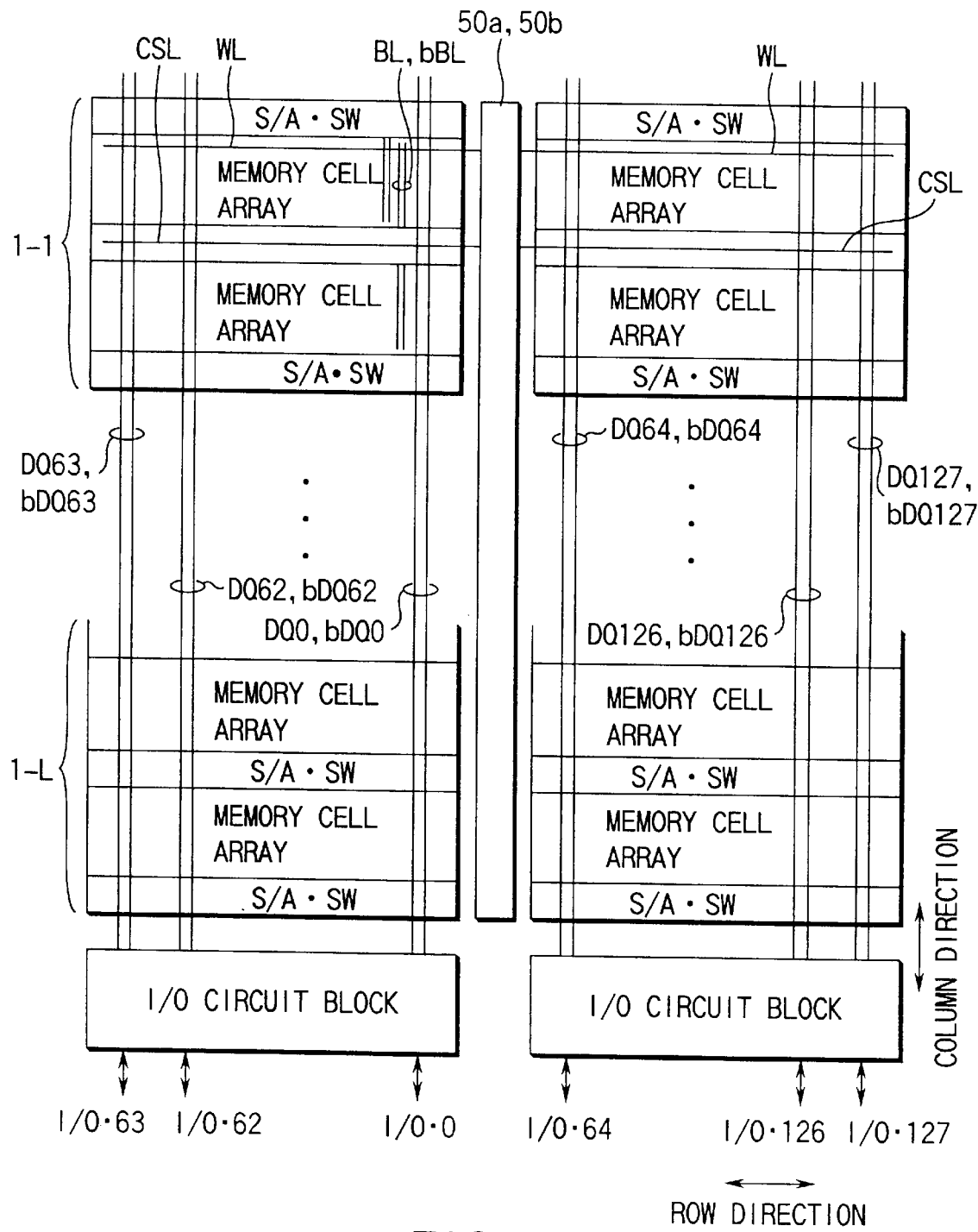
FIG. 10 shows DQ line pairs on the memory array block.

FIG. 10 shows a layout of signal lines, such as DQ line pairs DQ0, bDQ0, . . . , DQ127, bDQ127, on the L-number of memory array blocks 1-1, . . . , 1-L.

In this embodiment, it is assumed that the I/O number is 128. In this case, 128 DQ line pairs DQ0, bDQ0, . . . , DQ127, bDQ127 are arranged on the memory array blocks 1-1, . . . , 1-L. Specifically, the memory array blocks 1-1, . . . , 1-L are arranged in the column direction, and the 128 DQ line pairs DQ0, bDQ0, DQ127, bDQ127 extend from the I/O circuit block in the column direction. Word lines WL extend in the row direction and bit line pairs BL and bBL extend from the sense amplifiers S/A in the column direction. Column select lines extend in the row direction and are connected to the column switches SW.

Figure 11:
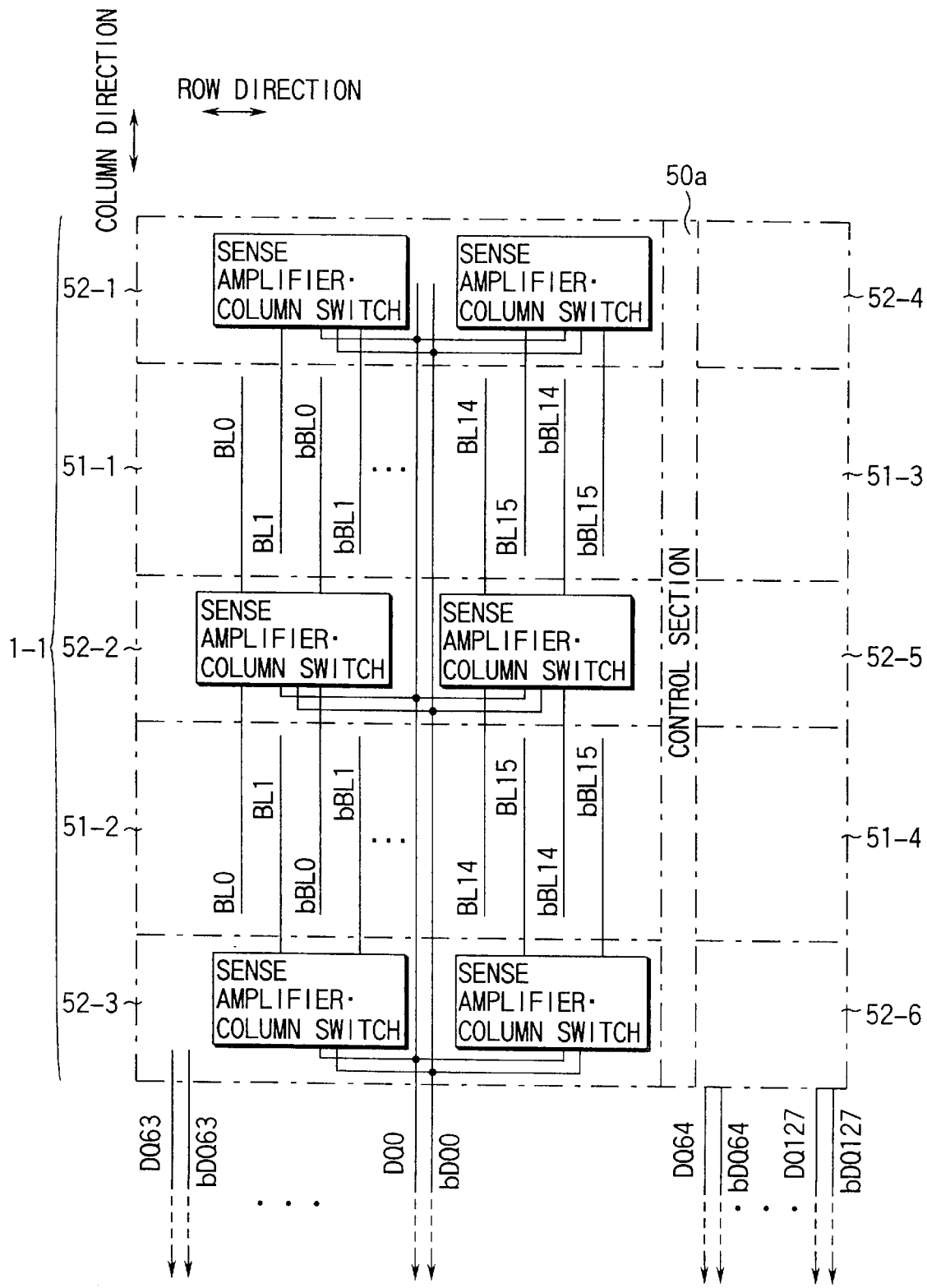
FIG. 11 shows bit line pairs connected to one DQ line pair.
Figure 12:
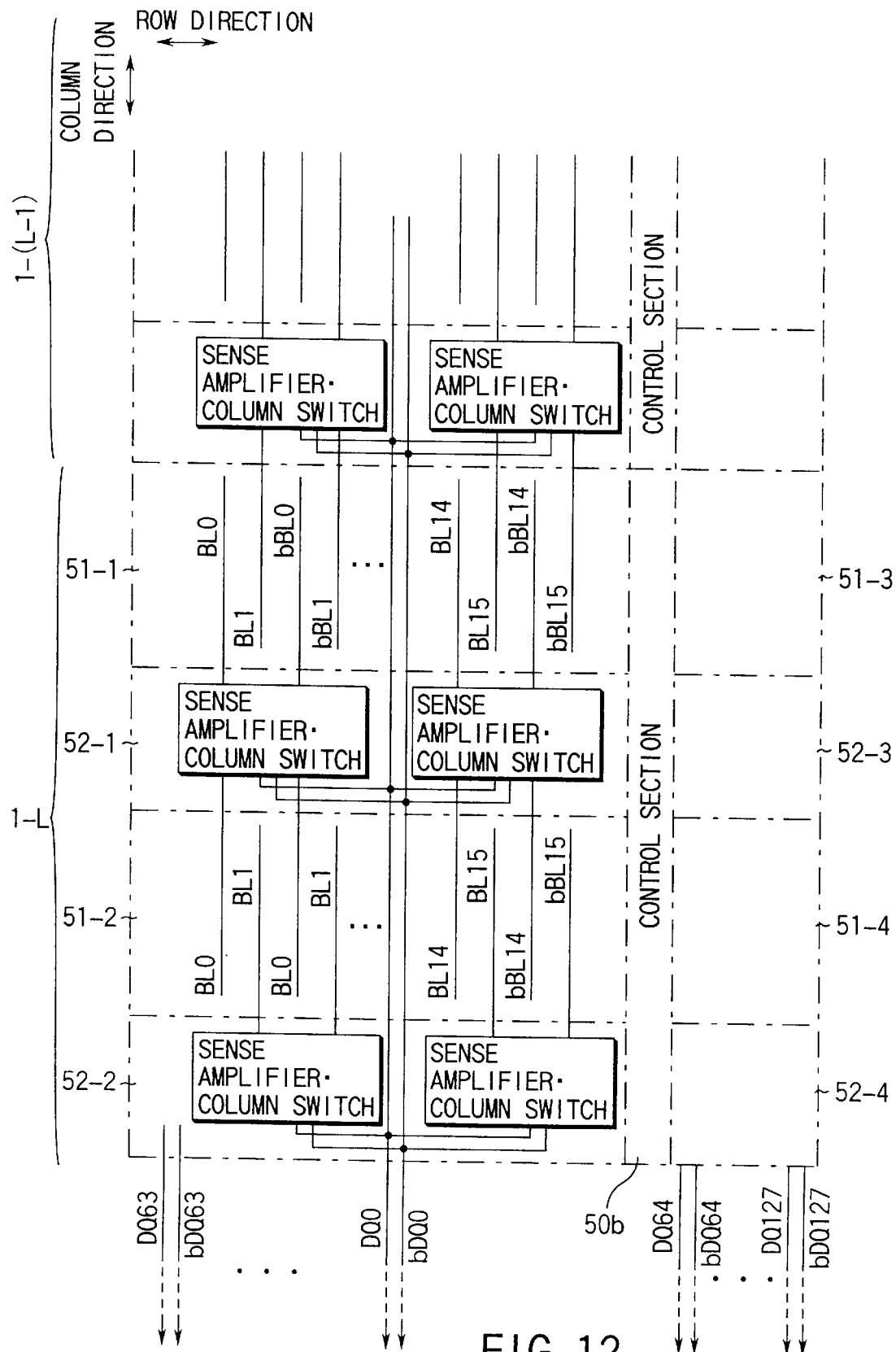
FIG. 12 shows bit line pairs connected to one DQ line pair.

FIG. 11 shows a relationship between the bit line pairs and DQ line pairs in the memory array block 1-1. FIG. 12 shows a relationship between the bit line pairs and DQ line pairs in the memory array block, 1-2, . . . , 1-L.

In this embodiment, in one memory array block 1-i (i=1, . . . , L), 32 bit line pairs BL0, bBL0, . . . , BL15, bBL15 are connected to one DQ line pair (data line pair) DQ0, bDQ0 via the sense amplifiers S/A and column switches SW.

In the normal-write mode, one of the 32 bit line pairs BL0, bBL0, . . . , BL15, bBL15 is selected by the column switches SW on the basis of the address signal. The selected one bit line pair is electrically connected to the DQ line pair (data line pair) DQ0, bDQ0 via the column switches SW. In the block-write mode, two of the 32 bit line pairs BL0, bBL0, . . . , BL15, bBL15 are selected by the column switches SW on the basis of the address signal. The selected two bit line pair are electrically connected to the DQ line pair (data line pair) DQ0, bDQ0 via the column switches SW.

In this embodiment, in one memory array block 1-i (i=1, . . . , L), 32 bit line pairs BL0, bBL0, . . . , BL15, bBL15 are connected to one DQ line pair (data line pair) DQ0, bDQ0. On the other hand, in one memory cell array 51-i (i=1, . . . , 4), 16 bit line pairs BL0, bBL0, . . . , BL15, bBL15 are connected to one DQ line pair (data line pair)

DQ0, bDQ0. However, the number of bit line pairs connected to one DQ line pair (data line pair) DQ0, bDQ0 in one memory array block 1-i (i=1, . . . , L) is not limited to 32, and may be, e.g. 4, 8, or 16.

The circuit configurations of the sense amplifier and column switch and specific layouts of the word lines and column select lines will be described later.

(2) A circuit configuration (or layout) for achieving a second object of the present invention, i.e. to provide a block-write function for simultaneously writing identical data to two or more memory cells of different addresses, will now be described.

A description will first be given of points to be noted at the time of the block-write mode.

Figure 13:
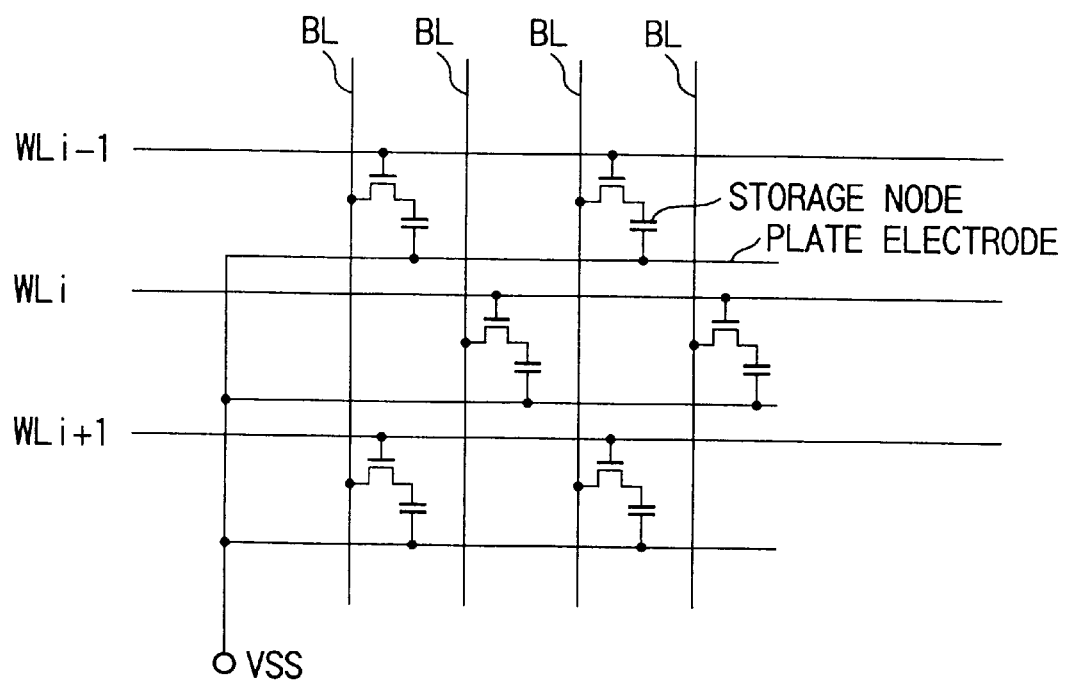
FIG. 13 shows a structure wherein all memory cells have a common plate electrode.

In the block-write mode, identical data is simultaneously written to two or more memory cells of different addresses. As is shown in FIG. 13, cell capacitors of memory cells have a common plate electrode. The potential of the plate electrode of the cell capacitors is set at a reference potential (e.g. ground potential) VSS.

In the block-write mode, however, if storage nodes of the cell capacitors of two or more memory cells are simultaneously charged (or discharged) to simultaneously write the same data to two or more memory cells with different addresses, the potential of the plate electrode may fluctuate due to capacitive coupling. The fluctuation in the plate potential will adversely affect the operation of the memory, and will cause, for example, malfunction.

Figure 14:
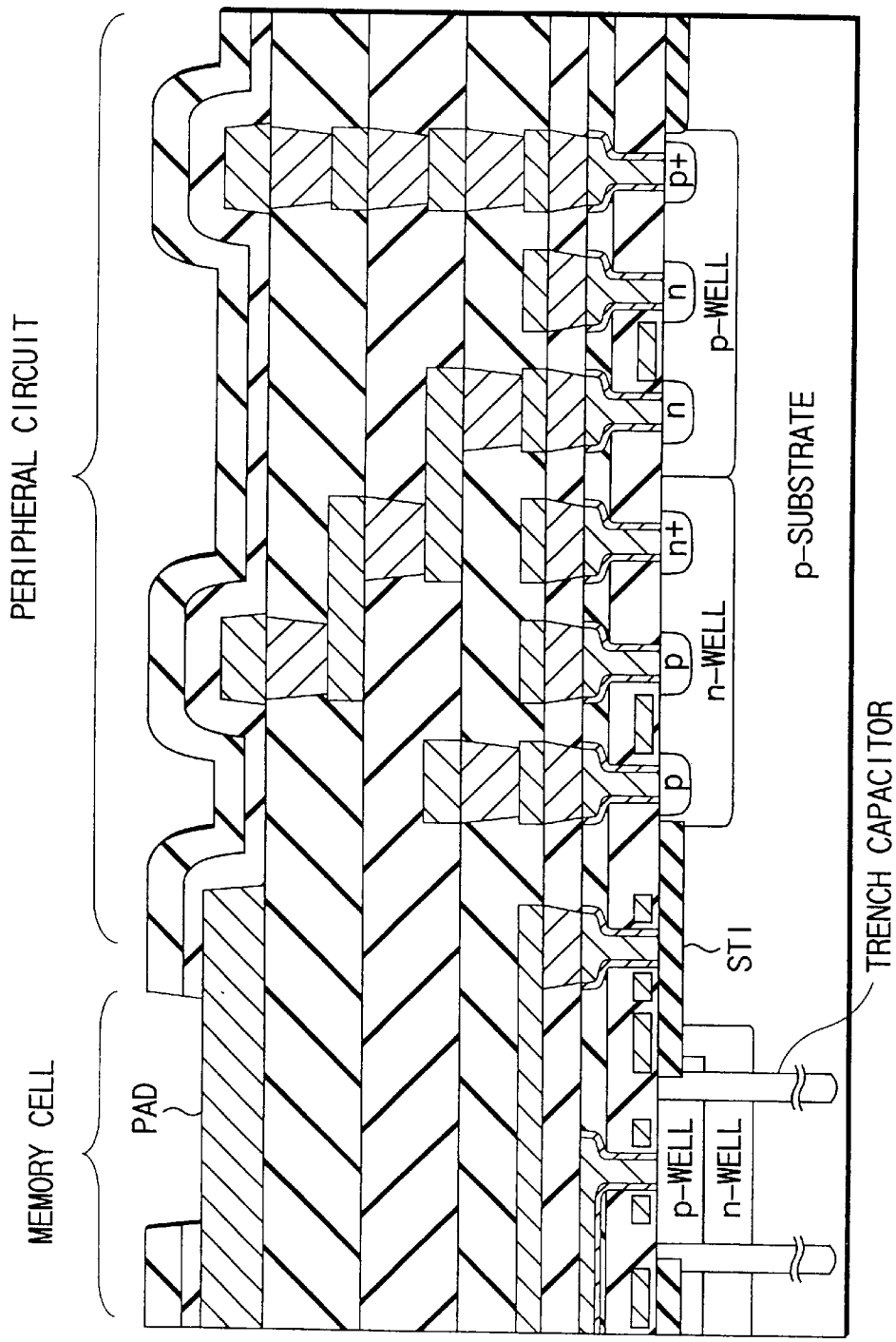
FIG. 14 shows a device structure of a DRAM having a trench-type capacitor.

In particular, when the cell capacitor of the memory cell is a trench capacitor, as shown in FIG. 14, the plate electrode of the cell capacitor is constituted by the substrate. On the other hand, MOS transistors constituting peripheral circuits, in addition to the memory cells, are formed in the substrate. Thus, the fluctuation in the plate potential, i.e. the fluctuation in the substrate potential, may adversely affect the peripheral circuits.

In order to achieve the block-write function, therefore, it is necessary to solve the problem of the fluctuation in plate potential.

Figure 15:
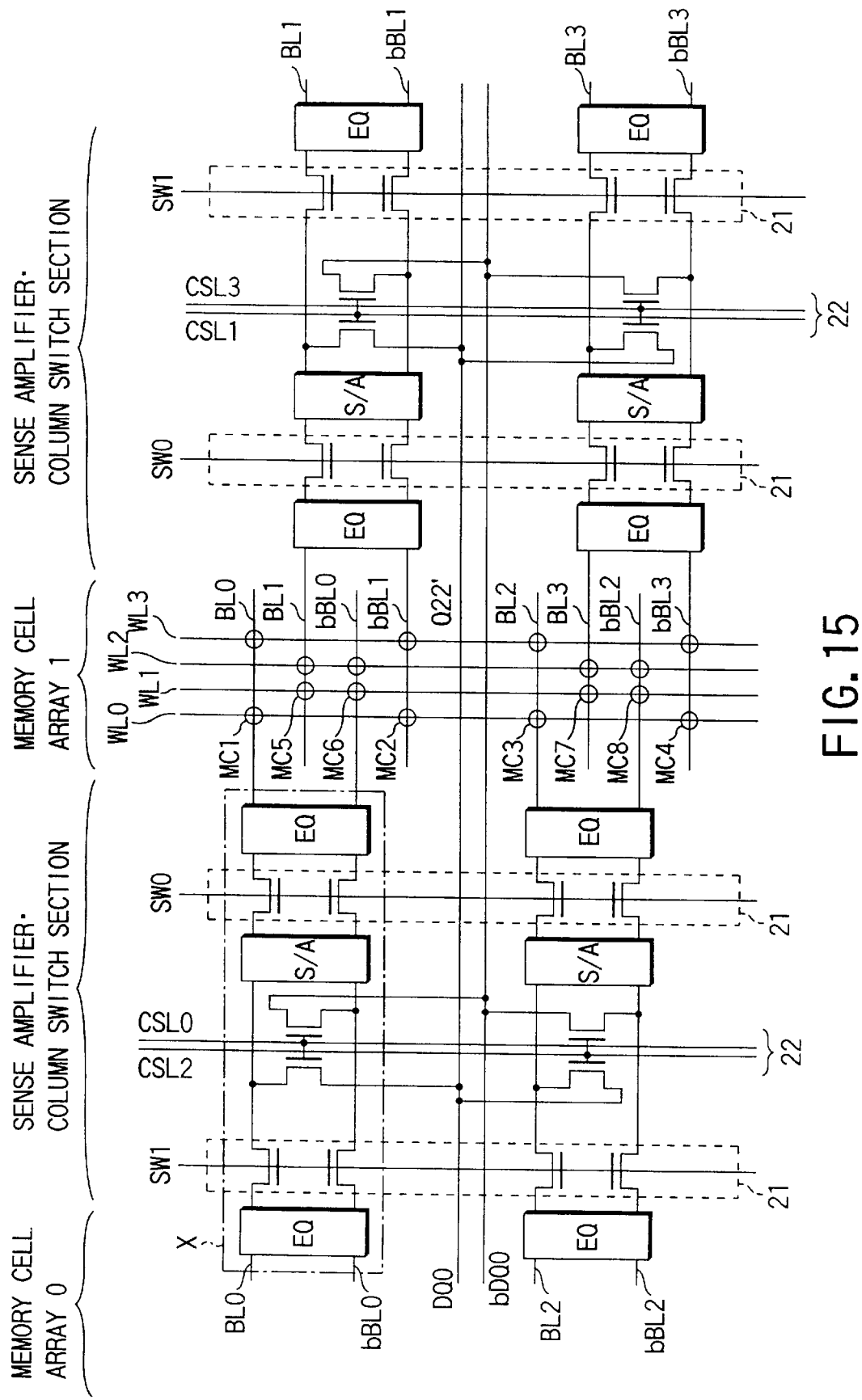
FIG. 15 shows in detail a layout of memory cells and a relationship in connection between DQ line pairs and bit line pairs.

FIG. 15 shows a circuit configuration capable of preventing a fluctuation in plate potential of the cell capacitor in the block-write mode.

In this embodiment, it is assumed that the layouts shown in FIGS. 7 to 12 are adopted.

The circuit of this embodiment is characterized by the position of the memory cells. Normally, data in memory cells is read as a potential difference between two bit lines BLi and bBLi constituting a bit line pair. Thus, the memory cell may be connected to only one of the two bit lines BLi and bBLi. Specifically, if the potentials of the two bit lines BLi and bBLi of the bit line pair are equalized and then the potential of one of the two bit lines BLi and bBLi is varied in accordance with the data of the memory cell, the data in the memory cell can be read.

At the time of data read/write, the potentials of the two bit lines BLi and bBLi constituting the bit line pair are always complementary (one being "L", and the other being "H"). In other words, if the cell capacitor of the memory cell connected to one of the two bit lines BLi and bBLi is charged to write "H" and if the cell capacitor of the memory cell connected to the other of the two bit lines BLi and bBLi is discharged to write "L", this means that the same data is written in the memory cells.

Accordingly, when the same data is to be written simultaneously to two or more memory cells (actually $2^P$ memory cells) having different addresses, the positions of the memory cells are devised to always equalize the number of memory cells in which storage nodes of the cell capacitors are charged to the number of memory cells in which storage nodes of the cell capacitors are discharged. Thereby, a rising component and a falling component of the plate potential due to capacitive coupling are canceled, and a fluctuation in the plate electrode potential of the cell capacitor can be prevented.

A description will now be given of a specific circuit configuration for preventing the fluctuation in the plate potential in the block-write mode.

The DRAM of this embodiment adopts a shared sense amplifier scheme. For example, the sense amplifier S/A is shared by two bit line pairs in two memory cell arrays 0 and 1. In addition, since the shared sense amplifier scheme is adopted in the DRAM, the DRAM is provided with switch circuits 21 for selecting memory cell arrays. For example, the switch circuits 21 select one of the two memory cell arrays 0 and 1, i.e. one of the two bit line pairs connected to one sense amplifier S/A. The selected one bit line pair is electrically connected to the one sense amplifier S/A. For example, when a select signal SW0 is "H" and a select signal SW1 is "L", the bit line pair in the memory cell array 1 is electrically connected to the sense amplifier S/A.

In this embodiment, when the select signal SW0 is "H" and the select signal SW1 is "L", four bit line pairs BL0, bBL0, . . . , BL3, bBL3 are connected to one DQ lien pair (data line pair) DQ0, bDQ0 via the sense amplifiers S/A. The selection of the four bit line pairs BL0, bBL0, . . . , BL3, bBL3 is effected by column switches 22.

For example, in the normal-write mode, column select signals CSL0, . . . , CSL3 select one of the four bit line pairs BL0, bBL0, . . . , BL3, bBL3. The selected one bit line pair is electrically connected to one DQ line pair DQ0, bDQ0. In the block-write mode, column select signals CSL0, . . . , CSL3 select two or more of the four bit line pairs BL0, bBL0, . . . , BL3, bBL3. The selected two or more bit line pairs are electrically connected to one DQ line pair DQ0, bDQ0.

One equalizer circuit EQ is provided for one bit line pair BLi, bBLi. The equalizer circuit EQ has a function of equalizing the potentials of the bit line pair BLi, bBLi, for example, at the time of data read.

The DRAM of this embodiment adopts a folded bit line scheme. Specifically, at the time of data read/write, the bit line pair, in which complementary data "L", "H" flows, is folded and disposed in the same memory cell array. Thus, the bit lines BLi, bBLi folded in the memory cell array 1, for example, constitute the bit line pair.

In addition, the bit lines extending from the sense amplifier S/A situated on one side of the memory cell array 1 and the bit lines extending from the sense amplifier S/A situated on the other side of the memory cell array 1 are alternately arranged on the memory cell array. For example, the bit line BL1 is positioned between the bit line pair BL0, bBL0, and the bit line bBL0 is positioned between the bit line pair BL1, bBL1.

In this case, since the interval of the two bit lines BLi, bBLi constituting one bit line pair is increased, the layout of the equalizer circuit EQ and sense amplifier S/A can be easily designed. Besides, the equalizer circuits EQ and sense amplifiers S/A arranged on one side of the memory cell array 1 are displaced from the equalizer circuits EQ and sense amplifiers S/A arranged on the other side of the memory cell array 1 by a distance corresponding to half the pitch of the sense amplifiers S/A (equalizer circuits EQ).

The bit line BLi is connected to the DQ line DQ0 via the column switch 22, and the bit line bBLi is connected to the DQ line bDQ0 via the column switch 22.

The layout of memory cells is determined to meet the following conditions.

A memory cell is provided at only one of two intersections between one word line WLj and one bit line pair BLi, bBLi. As regards the memory cells connected to one word line WLj, the number of memory cells connected to the intersection between the word line WLj and bit line BLi is made equal to the number of memory cells connected to the intersection between the word line WLj and bit line bBLi. As regards the memory cells connected to one bit line pair BLi, bBLi, the number of memory cells connected to the bit line BLi is made equal to the number of memory cells connected to the bit line bBLi.

In this embodiment, for example, a memory cell MC1 is connected at an intersection between the word line WL0 and bit line BL0. A memory cell MC2 is connected at an intersection between the word line WL0 and bit line bBL1. A memory cell MC3 is connected at an intersection between the word line WL0 and bit line BL2. A memory cell MC4 is connected at an intersection between the word line WL0 and bit line bBL3. A memory cell MC5 is connected at an intersection between the word line WL1 and bit line BL1. A memory cell MC6 is connected at an intersection between the word line WL1 and bit line bBL0. A memory cell MC7 is connected at an intersection between the word line WL1 and bit line BL3. A memory cell MC8 is connected at an intersection between the word line WL1 and bit line bBL2.

In this embodiment, since the four word lines WL0, . . . , WL3 are provided, two memory cells are connected to the bit line BLi, and also two memory cells are connected to the bit line bBLi.

It is important in the present invention that in the block-write mode two or more bit line pairs are selected by the column select signals CSL0, . . . , CSL3 so that the number of those memory cells connected to the bit line BLi, which are among the memory cells connected to the selected word line, may always be equal to the number of memory cells connected to the bit line bBLi.

For example, when the word line WL0 is selected in the block-write mode, two bit line pairs BL0, bBL0, BL1, bBL1; two bit line pairs BL2, bBL2, BL3, bBL3; two bit line pairs BL0, bBL0, BL3, bBL3; two bit line pairs BL1, bBL1, BL2, bBL2; or all bit line pairs BL0, bBL0, . . . , BL3, bBL3 are selected.

If two bit line pairs BL0, bBL0, BL1, bBL1 are selected, the column select signals CSL0, CSL1 become "H" and the column select signals CSL2, CSL3 become "L". At this time, the two bit line pairs BL0, bBL0, BL1, bBL1 are electrically connected to one DQ line pair DQ0, bDQ0. Although the memory cell MC1 connected to the word line WL0 is connected to the bit line BL0, none of the memory cells connected to the word line WL0 is connected to the bit line bBL0. On the other hand, none of the memory cells connected to the word line WL0 is connected to the bit line BL1, the memory cell MC2 connected to the word line WL0 is connected to the bit line bBL1.

When identical data is to be written in the memory cells MC1 and MC2, complementary data is written in the memory cells MC1 and MC2. Specifically, when the cell capacitor of the memory cell MC1 is charged, the cell capacitor of the memory cell MC2 is discharged. When the cell capacitor of the memory cell MC1 is discharged, the cell capacitor of the memory cell MC2 is charged.

As has been described above, in the present invention, the layout of the memory cells is devised and the bit line pairs selected in the block-write mode are controlled, whereby the potential fluctuation of the plate electrode of the cell capacitor in the block-write mode can be prevented. Thus, the second object of the invention can be achieved, that is, the block-write function of simultaneously writing identical data to two or more memory cells of different addresses can be achieved. The control circuit (column decoder) for selecting bit line pairs will be described later in detail.

Figure 16:
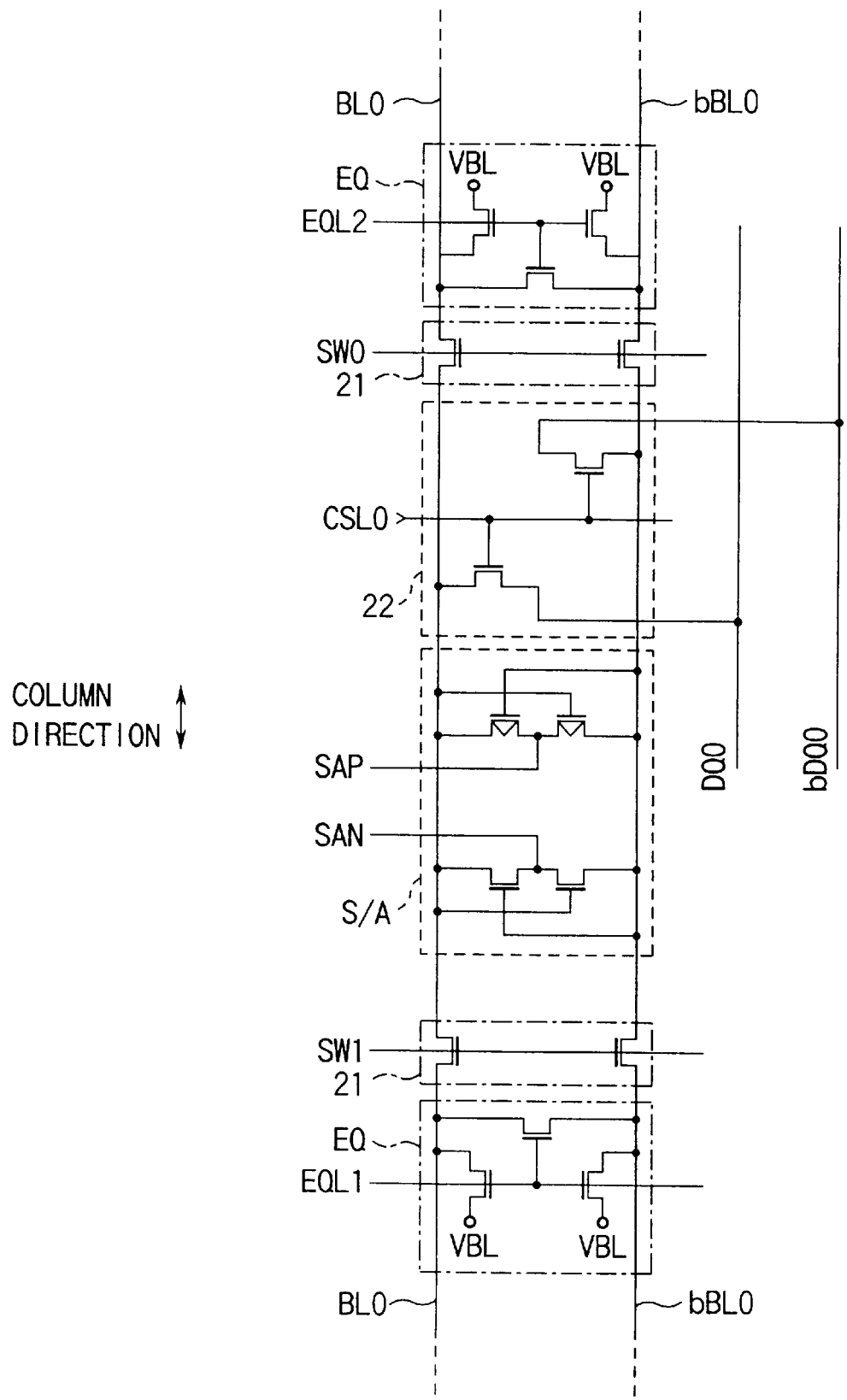
FIG. 16 is a circuit diagram showing in detail an area X in FIG. 15.

FIG. 16 shows a specific example of an area X indicated by a dot-and-dash line in FIG. 15.

The sense amplifier S/A comprises two P-channel MOS transistors and two N-channel MOS transistors. When a control signal SAP is "H" and a control signal SAN is "L", the sense amplifier S/A is set in an active state (operative state). When the sense amplifier S/A is in the active state, the sense amplifier S/A senses a small potential difference between the two bit lines BL0 and bBL0 and sets the bit line with a higher potential at "H" and the bit line with a lower potential at "L".

The equalizer circuit EQ comprises three N-channel MOS transistors. When control signals EQL1 and EQL are "H", the equalizer circuit EQ is set in an active state (operative state). When the equalizer circuit EQ is in the active state, the potentials of the two bit lines BL0 and bBL0 constituting one bit line pair are equal and have a constant potential value VBL.

Figure 17:
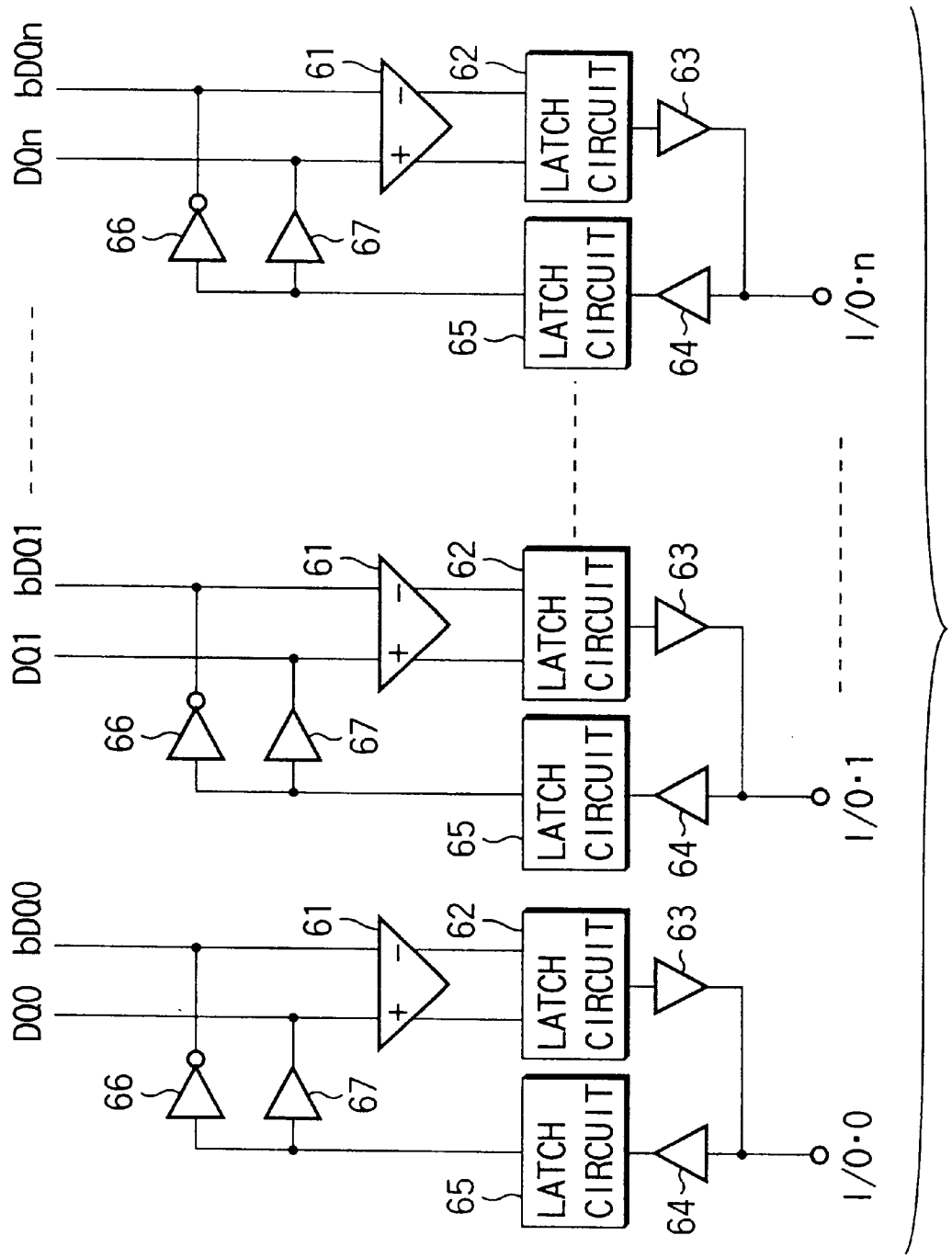
FIG. 17 shows an example of an I/O circuit block.

FIG. 17 shows a specific example of the I/O circuit block.

A DQ line pair, DQi and bDQi, is connected to an output latch circuit 62 via a differential amplifier 61. Output data from the output latch circuit 62 is delivered to an output buffer (or a register) 63 and output from the memory core. Input data is delivered to an input latch circuit 65 via an input buffer (or a register) 64. The data input to the input latch circuit 65 is delivered to the DQ line (data line) bDQi via an inversion buffer 66 and also to the DQ line (data line) DQi via a buffer 67.

The DQ line pair DQ0, bDQ0 in FIGS. 15 and 16 corresponds to the DQ line pair DQ0, bDQ0 in FIG. 17. For example, where 128 DQ line pairs DQ0, bDQ0, . . . , DQ127, bDQ127 are arranged in the memory core, 128 (n=127 in FIG. 17) I/O circuits each comprising elements 61 to 66 are arranged in the memory core, too.

The control circuit (column decoder) for selecting the bit line pairs will now be described in detail.

Figure 18:
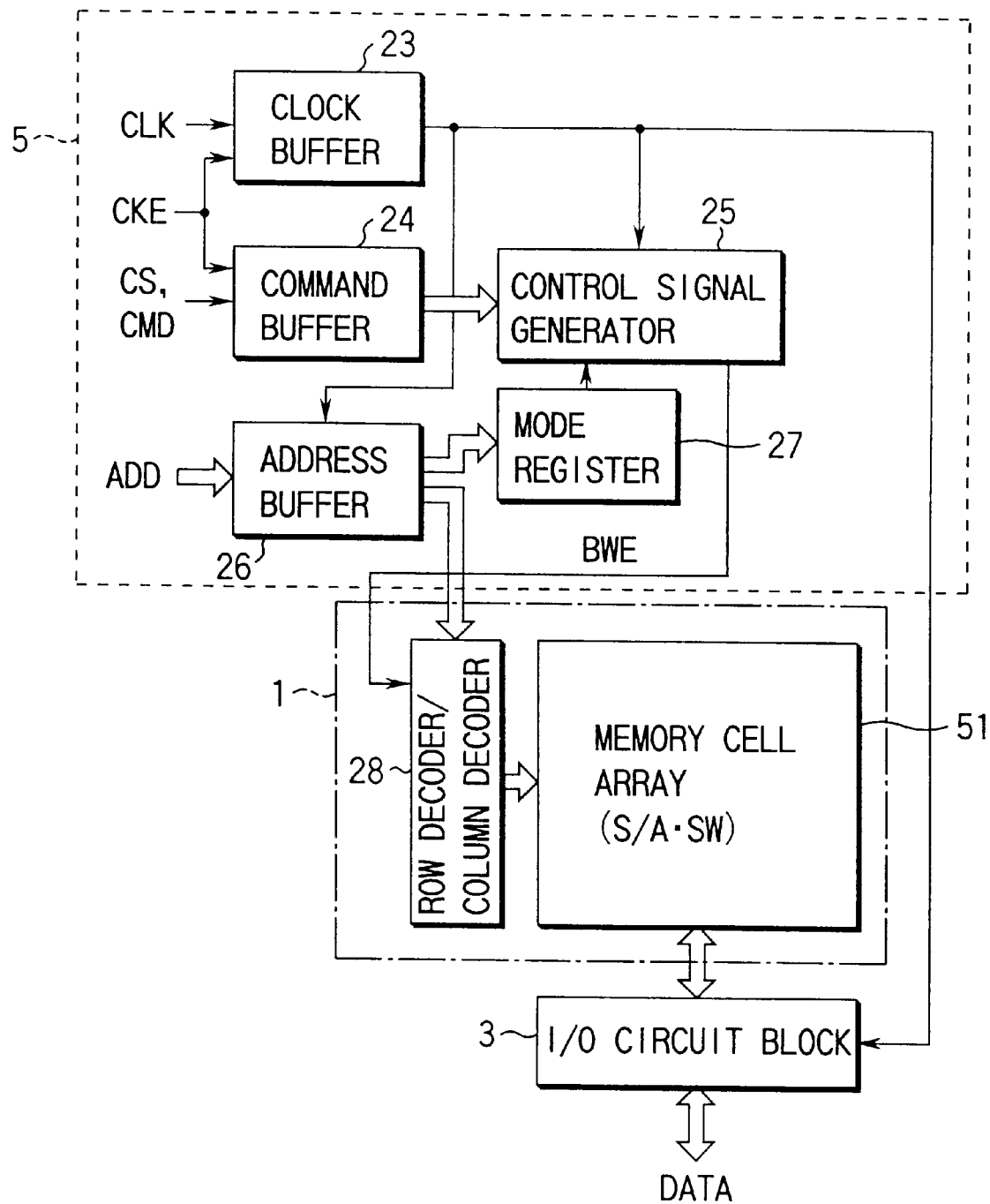
FIG. 18 shows a main part of a DRAM having a block-write function.

FIG. 18 shows a specific example of the control block in the memory core.

A clock signal CLK is generated from, e.g. a CPU provided outside the memory core (or chip). The clock signal CLK is input to a clock buffer 23 in the control block 5 within the memory core. A clock signal output from the clock buffer 23 is input to an address buffer 26, a control signal generator 25 and the I/O circuit block (I/O buffer) 3.

A chip select signal CS and a command signal CMD are input to a command buffer 24. The chip select signal CS is used to select one of chips for data write/read, where there are plural chips in which a memory core (or memory) is formed and which are interconnected over a bus. The command CMD is used to determine an operation mode (normal-write mode, block-write mode, read mode, etc.) of the memory core (or memory).

When a clock enable signal CKE is enabled (e.g. "H"), the clock buffer 23 and command buffer 24 are set in the active state (operative state).

Address signals (row address signal and column address signal) ADD are input to a mode register 27 and a row decoder/column decoder 28 via the address buffer 26. The mode register 27 determines a burst length in image processing.

The control signal generator 25 generates plural control signals for controlling the operation of the memory, on the basis of the command signal and the output signal from the mode register 27. In particular, in the present invention, the control signal generator 25 generates a control signal (block-write enable signal) BWE for controlling the column decoder 28. Specifically, when the command signal indicates the execution of the block-write mode, the control signal generator 25 sets the block-write enable signal BWE at the enable state (e.g. "H"). The block-write enable signal BWE is used to select plural columns (bit line pairs) in the block-write mode.

The memory array block 1 corresponds to one of the memory array blocks 1-1, ..., 1-L in FIG. 7, and the I/O circuit block 3 corresponds to the I/O circuit block 3 in FIG. 7.

Figure 19:
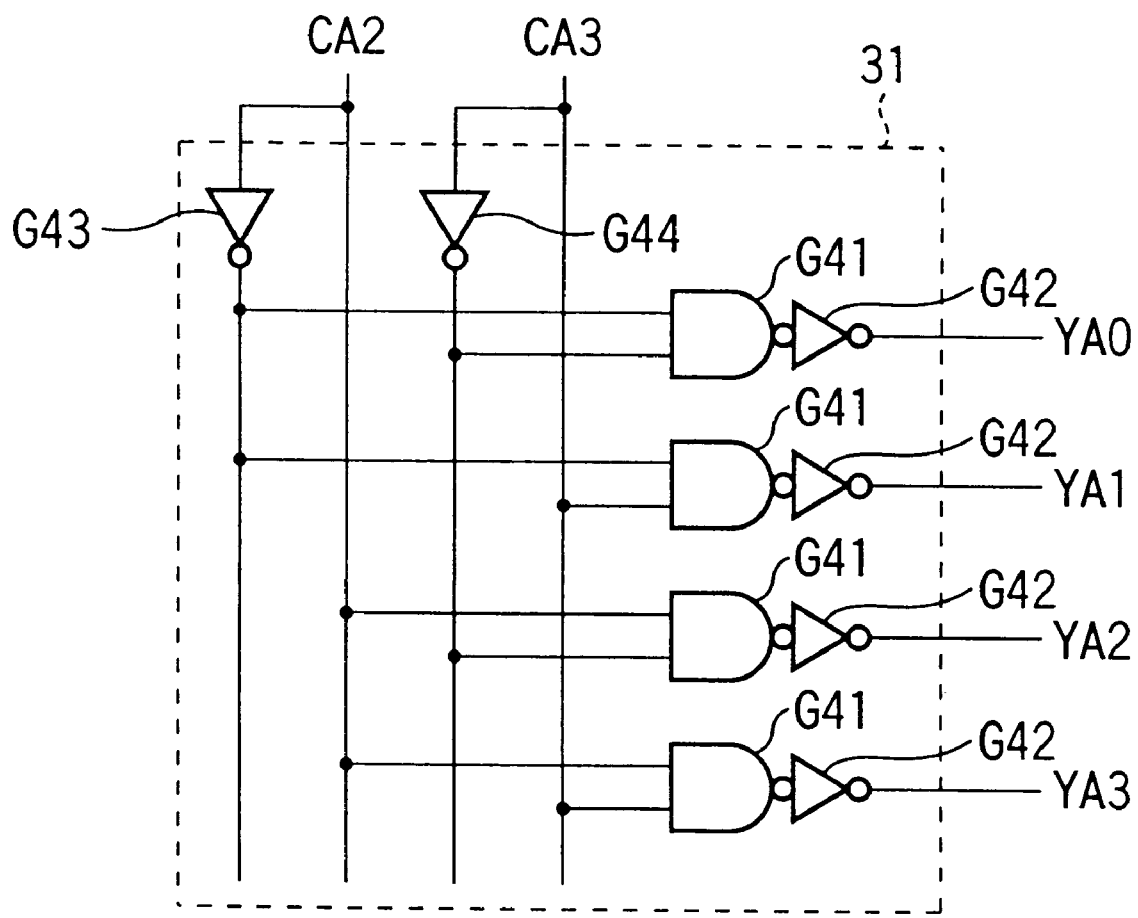
FIG. 19 shows an example of a memory cell array selection decoder in the DRAM shown in FIG. 18.
Figure 20:
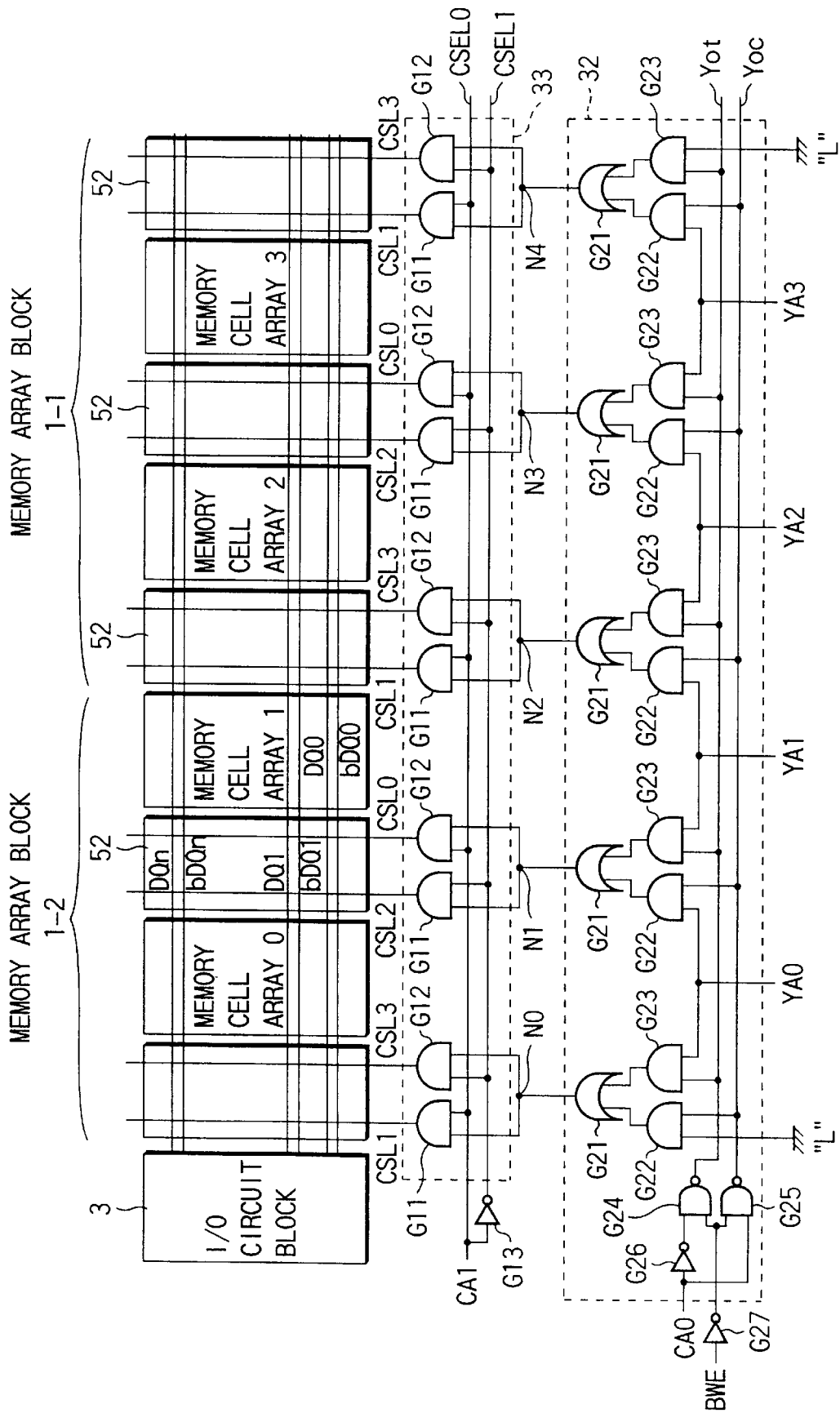
FIG. 20 shows an example of a bit line pair selection decoder in the DRAM shown in FIG. 18.

FIGS. 19 and 20 show examples of the column decoder in the memory core.

In this embodiment, it is assumed that in the normal-write mode one memory cell array 51 is selected and one bit line pair BLi, bBLi is electrically connected to one DQ line pair DQi, bDQi in the selected memory cell array 51. It is also assumed that in the block-write mode one memory cell array 51 is selected and two bit line pairs are electrically connected to one DQ line pair DQi, bDQi in the selected memory cell array 51. The memory cell array 51 shown in FIG. 15 is adopted.

To make the description simple, suppose that the number of memory cell arrays 51 is four and four bit line pairs are connected to one DQ line pair DQi, bDQi (see FIG. 15).

Needless to say, the present invention is applicable to cases other than the cases of the above conditions (in particular, the conditions for the block-write mode). For example, in the block-write mode, plural memory cell arrays may be selected, or more than two bit line pairs may be selected.

A memory cell array selection decoder 31 shown in FIG. 19 comprises NAND circuits G41 and inverter circuits G42, G43 and G44. The memory cell array selection decoder 31 selects one of the four memory cell arrays. The selection of the memory cell array is effected by two-bit control signals, for example, two-bit column address signals CA2 and CA3. For example, when CA2 is "L" and CA3 is "L", YA0 is "H". When CA2 is "L" and CA3 is "H", YA1 is "H". When CA2 is "H" and CA3 is "L", YA2 is "H". When CA2 is "H" and CA3 is "H", YA3 is "H".

When YA0 is "H", the memory cell array 0 is selected. When YA1 is "H", the memory cell array 1 is selected. When YA2 is "H", the memory cell array 2 is selected. When YA3 is "H", the memory cell array 3 is selected.

A column (bit line pair) selection decoder, as shown in FIG. 20, comprises a first decoder 32 and a second decoder 33. In the normal-write mode and read mode, the column selection decoder selects one of the four bit line pairs connected to one DQ line pair DQi, bDQi in the selected one memory cell array. The selection of the bit line pairs is effected by two-bit control signals, for example, two-bit column address signals CA0 and CA1. In the block-write mode, the column selection decoder selects two of the four bit line pairs connected to one DQ line pair DQi, bDQi in the selected one memory cell array.

The first decoder 32 comprises NOR circuits G21, AND circuits G22, G23, NAND circuits G24, G25, and inverter circuits G26, G27. In the normal-write mode and read mode, the first decoder 32 selects either the bit line pairs connected to the sense amplifier S/A provided on one side of the selected memory cell array or the bit line pairs connected to the sense amplifier S/A provided on the other side of the selected memory cell array. In the block-write mode, the first decoder 32 selects both the bit line pairs connected to the sense amplifier S/A provided on one side of the selected memory cell array and the bit line pairs connected to the sense amplifier S/A provided on the other side of the selected memory cell array.

Suppose that YA1 is "H" and the memory cell array 1 is selected. In this case, in the normal-write mode and read mode, the block-write enable signal BWE is "L". Thus, the values of nodes N0, N1, N2, N3 and N4 are determined by the value of the column address signal CA0. When the column address signal CA0 is "L", the node N2 alone is "H" and the other nodes N0, N1, N3 and N4 are "L". When the column address signal CA0 is "H", the node N1 alone is "H" and the other nodes N0, N2, N3 and N4 are "L". In the block-write mode, the block-write enable signal BWE is "H". Thus, irrespective of the value of the column address signal CA0, both nodes N1 and N2 are "H" and the other nodes N0, N3 and N4 are "L".

The second decoder 33 comprises AND circuits G11, G12 and an inverter circuit G13. The second decoder 33 selects one of two bit line pairs (commonly connected to one DQ line pair) connected to the sense amplifier S/A provided on the selected side of the selected memory cell array.

For example, when YA1 is "H" and node N1 is "H", the second decoder 33 receives the column address signal CA1 and sets one of the column select signals CSL0 and CSL2, produced in the vicinity of the memory cell array 1, at "H" level. When YA1 is "H" and node N2 is "H", the second decoder 33 receives the column address signal CA1 and sets one of the column select signals CSL1 and CSL3, produced in the vicinity of the memory cell array 1, at "H" level.

Specifically, in the normal-write mode and read mode, as shown in FIGS. 15 and 20, when YA1 is "H" (when the memory cell array 1 is selected), one of the bit line pairs BL0, bBL0, ..., BL3, bBL3 is electrically connected to the DQ line pair DQ0, bDQ0 by the values of the column address signals CA0, CA1. In the block-write mode, when YA1 is "H" and the column address signal CA1 is "L", the column select signals CSL2 and CSL3, produced in the vicinity of the memory cell array 1, are set at "H", and the bit line pairs BL2, bBL2, BL3, bBL3 are electrically connected to the DQ line pair DQ0, bDQ0 in the memory cell array 1. In the block-write mode, when YA1 is "H" and the column address signal CA1 is "H", the column select signals CSL0 and CSL1, produced in the vicinity of the memory cell array 1, are set at "H" and the bit line pairs BL0, bBL0, BL1, bBL1 are electrically connected to the DQ line pair DQ0, bDQ0 in the memory cell array 1.

The memory cell array 1 in FIG. 20 corresponds to the memory cell array 1 in FIG. 15, and the sense amplifier/column switch section 52 in FIG. 20 corresponds to the sense amplifier/column switch section in FIG. 15.

Specific operations in the write mode will now be described.

① NORMAL-WRITE MODE

In this mode, the block-write enable signal BWE is "L". Assuming that the column address signals CA0 and CA1 are "H", the column address signal CA2 is "L" and the column address signal CA3 is "H", the output signal YA1 alone of the output signals YA0, YA1, YA2 and YA3 of the memory cell array selection decoder is "H" (see FIG. 19).

In addition, a signal line Yoc in the column selection decoder (first decoder) is "L", and a signal line Yot is "H". The node N1 is "H" and the nodes N0, N2, N3 and N4 are "L". Thus, the column selection decoder (second decoder) sets the column select signal CSL0 alone, produced in the vicinity of the memory cell array 1, at "H", and sets the other column select signals CSL0, CSL1, CSL2 and CSL3 at "L" (see FIG. 20).

At this time, in the memory cell array 1, for example, the bit line pair, BL0, bBL0 is electrically connected to the DQ line pair DQ0, bDQ0. When the word line WL0 is selected, the data write operation for the memory cell MC1 is performed. When the word line WL1 is selected, the data write operation for the memory cell MC6 is performed (see FIG. 15).

② BLOCK-WRITE MODE

In this mode, the block-write enable signal BWE is "H". Assuming that the column address signals CA0 and CA1 are "H", the column address signal CA2 is "L" and the column address signal CA3 is "H", the output signal YA1 alone of the output signals YA0, YA1, YA2 and YA3 of the memory cell array selection decoder is "H" (see FIG. 19).

The signal lines Yoc, Yot in the column selection decoder (first decoders) are "H", irrespective of the value of the column address signal CA0. Thus, the nodes N1, N2 are "H", and the nodes N0, N3 and N4 are "L". Accordingly, the column selection decoder (second decoder) sets the column select signals CSL0 and CSL1, produced in the vicinity of the memory cell array 1, at "H", and sets the other column select signals CSL0, CSL1, CSL2 and CSL3 at "L" (see FIG. 20).

At this time, in the memory cell array 1, for example, the bit line pairs, BL0, bBL0, BL1, bBL1, are electrically connected to the DQ line pair DQ0, bDQ0. When the word line WL0 is selected, the data write operation for the memory cells MC1 and MC2 is performed. When the word line WL1 is selected, the data write operation for the memory cells MC5 and MC6 is performed (see FIGS. 21 and 24).

Figure 21:
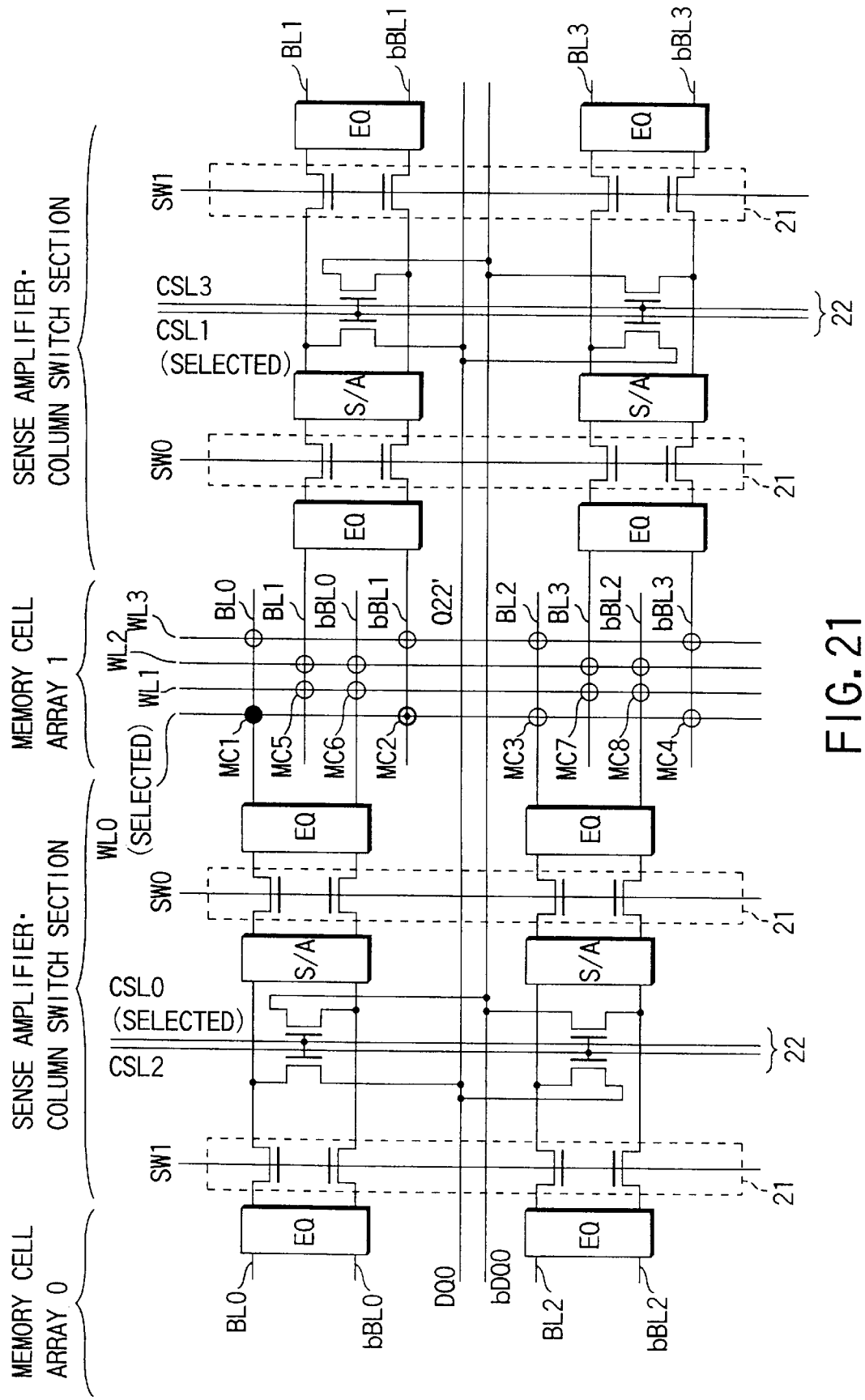
FIG. 21 shows memory cells (●, ◎) at which data write is effected in the block-write mode when the circuit shown in FIG. 20 is used.
Figure 24:
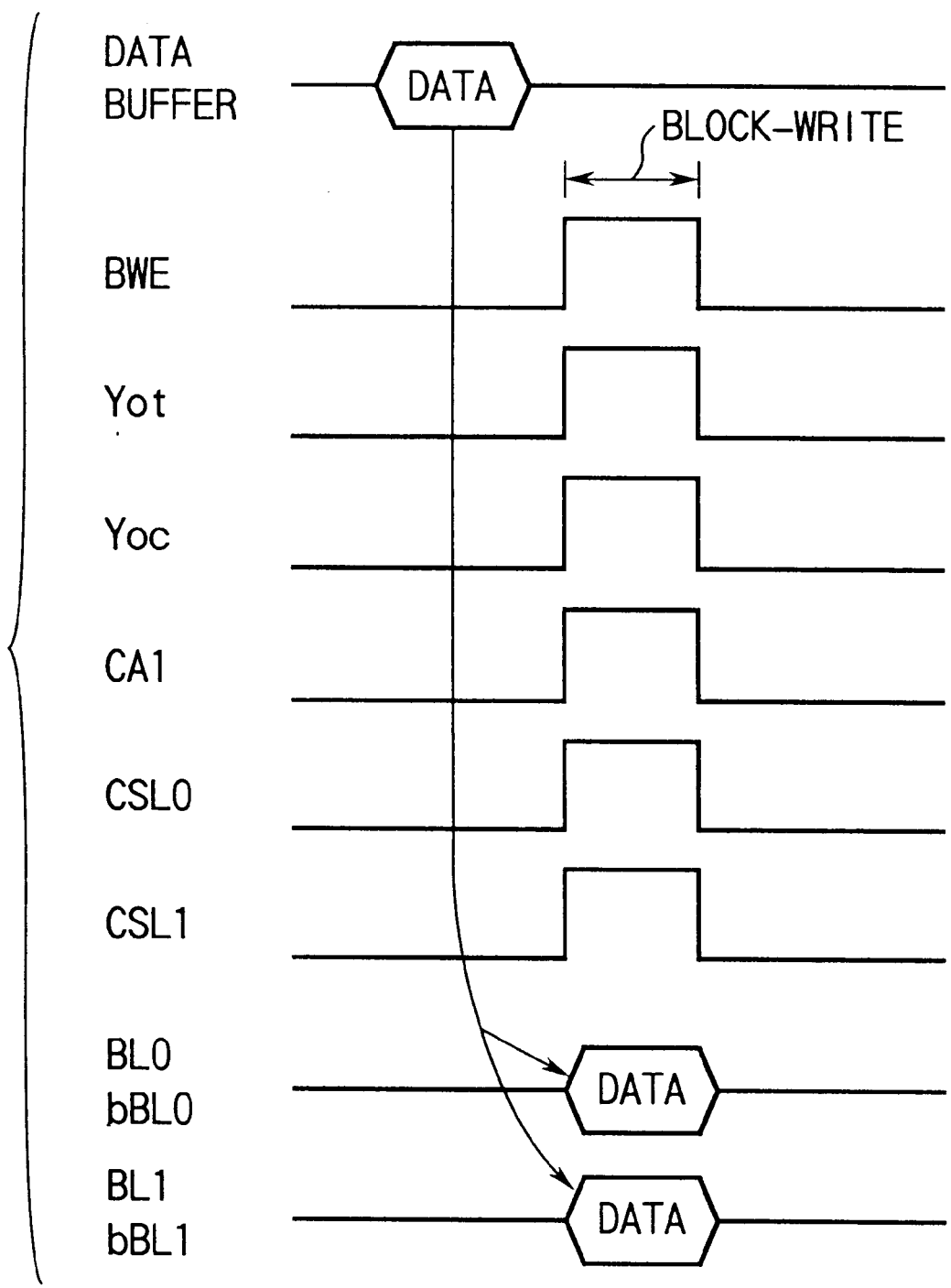
FIG. 24 shows waveforms of signals used in the write operation in the block-write mode.

As is shown in FIGS. 21 and 24, when the word line WL1 is selected, the potential applied to the memory cell MC1 and the potential applied to the memory cell MC2 are complementary to each other (if one is "H", the other is "L"). For example, if "1" is written in the memory cell MC1, "0" is written in the memory cell MC2. More specifically, as regards the cell capacitors of memory cells MC1 and MC2, if one is charged, the other is discharged. Thus, fluctuation in potential of the plate electrode shared by the cell capacitors can be prevented.

Moreover, in the present invention, the data written in the memory cell MC1 and the data written in the memory cell MC2 have opposite values, and this means that the same data is actually written in the memory cells MC1 and MC2. The reason is that the data of the DQ line DQ0 is supplied to the memory cell MCi, and the data of the DQ line bDQ0 is supplied to the memory cell MC2. In other words, although the data of the DQ line DQ0 and the data of the DQ line bDQ0 have opposite values, single data is expressed by the complementary data ("L", "H") of the DQ line pair DQ0, bDQ0. As a result, the same data is written in the memory cells MCi and MC2.

Figure 22:
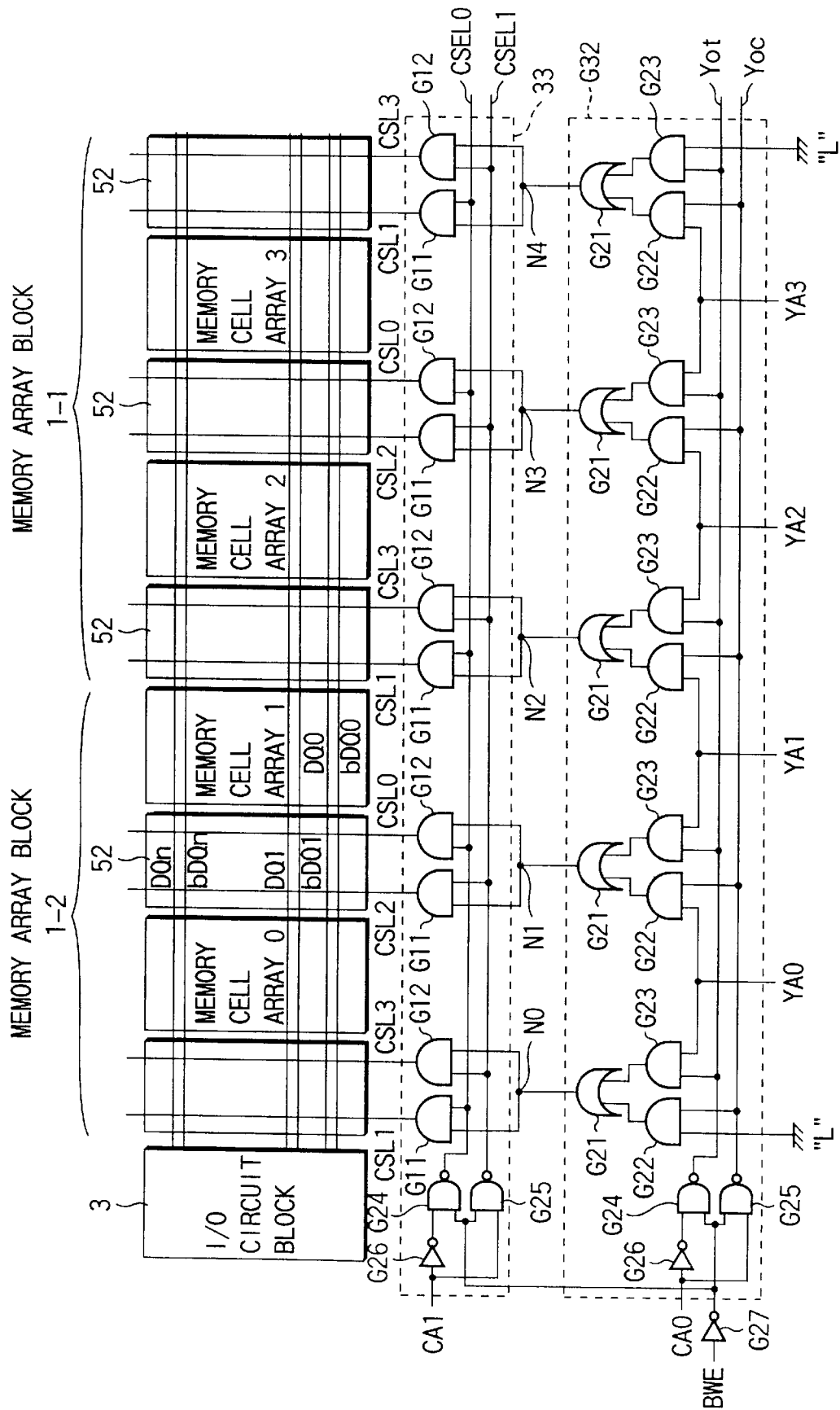
FIG. 22 shows a modification of the circuit shown in FIG. 20.
Figure 23:
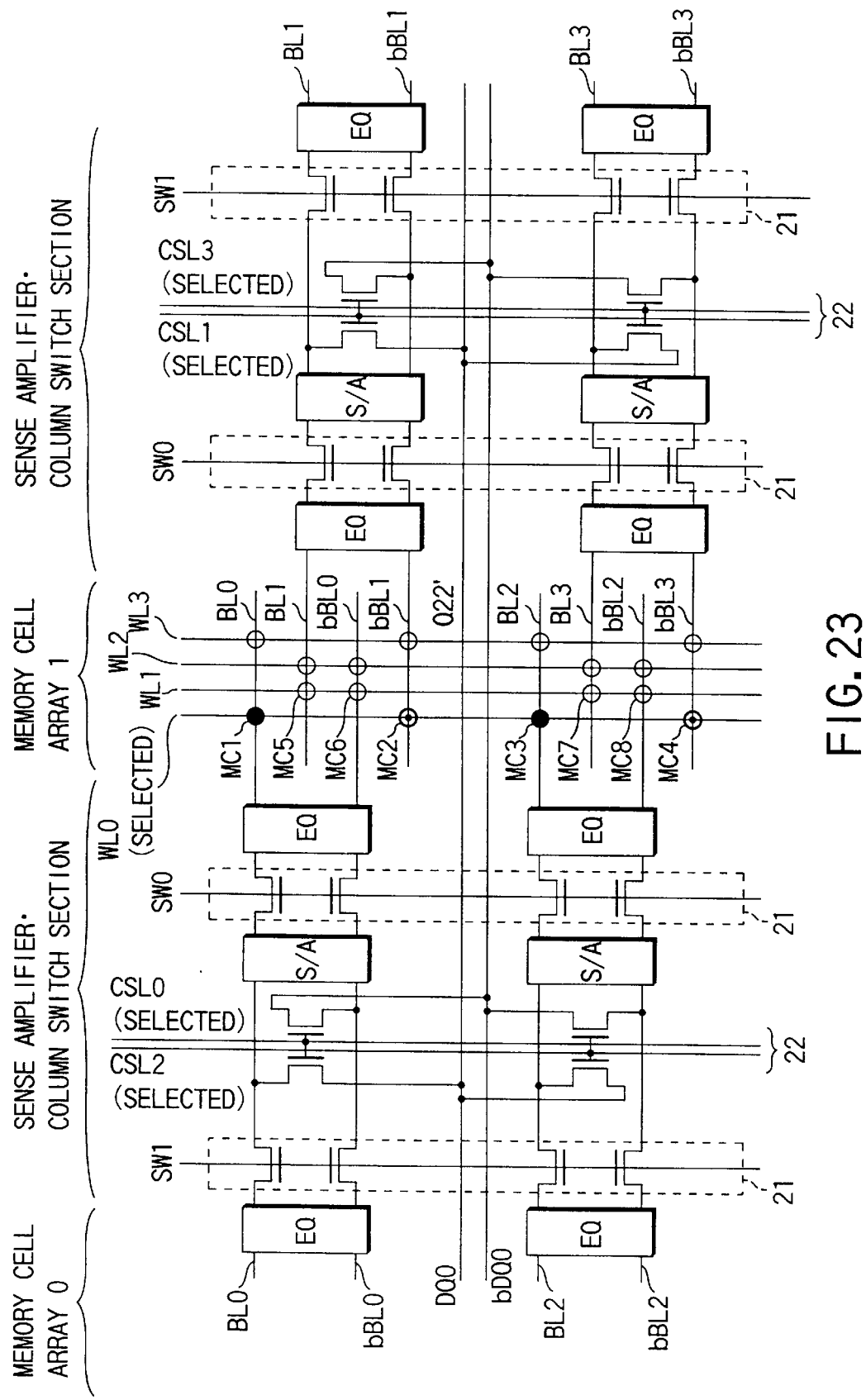
FIG. 23 shows memory cells (●, ◎) at which data write is effected in the block-write mode when the circuit shown in FIG. 22 is used.

FIGS. 22 and 23 show a modification of the circuit shown in FIGS. 20 and 21.

This modified circuit is characterized by having a function of selecting all of the four bit line pairs BL0, bBL0, . . . , BL3, bBL3 connected to one DQ line pair DQ0, bDQ0 in one selected memory cell array 1 in the block-write mode. This circuit differs from the circuit shown in FIGS. 20 and 21 with respect to the column selection decoder (second decoder). Specifically, the column selection decoder (second decoder) of this circuit sets both signal lines CSEL0 and CSEL1 at "H", irrespective of the value of the column address signal CA1, if the block-write enable signal BWE becomes "H" in the block-write mode.

Specific examples will now be considered.

Assuming that the column address signals CA0 and CA1 are "H", the column address signal CA2 is "L" and the column address signal CA3 is "H" in the block-write mode, the output signal YA1 alone of the output signals YA0, YA1, YA2 and YA3 of the memory cell array selection decoder is "H" (see FIG. 19).

The signal lines Yoc, Yot in the column selection decoder (first decoders) are "H", irrespective of the value of the column address signal CA0. Thus, the nodes N1, N2 are "H", and the nodes N0, N3 and N4 are "L". Accordingly, the signal lines CSEL0 and CSEL1 in the column selection decoder (second decoder) are "H", irrespective of the value of the column address signal CA1.

Thus, the column select signals CSL0, CSL1, CSL2, CSL3, produced in the vicinity of the memory cell array 1, are "H", and the other column select signals CSL0, CSL1, CSL2 and CSL3 are "L" (see FIG. 22).

At this time, in the memory cell array 1, for example, the bit line pairs, BL0, bBL0, . . . , BL3, bBL3, are electrically connected to the DQ line pair DQ0, bDQ0. When the word line WL0 is selected, the data write operation for the memory cells MC1, MC2, MC3 and MC4 is performed. When the word line WL1 is selected, the data write operation for the memory cells MC5, MC6, MC7 and MC8 is performed (see FIG. 23).

As is shown in FIG. 23, when the word line WL1 is selected, the potential applied to the memory cell MC1, MC3 and the potential applied to the memory cell MC2, MC4 are complementary to each other (if one is "H", the other is "L"). For example, if "1" is written in the memory cell MC1, MC3, "0" is written in the memory cell MC2, MC4. More specifically, the cell capacitors of memory cells MC1 and MC3 are charged, the cell capacitors of the memory cells MC2 and MC4 are discharged. Thus, fluctuation in potential of the plate electrode shared by the cell capacitors can be prevented.

Moreover, in the present invention, the data written in the memory cell MC1, MC3 and the data written in the memory cell MC2, MC4 have opposite values, and this means that the same data is actually written in the memory cells MC1, MC2, MC3, MC4. The reason is that the data of the DQ line DQ0 is supplied to the memory cells MC1, MC3, and the data of the DQ line bDQ0 is supplied to the memory cells MC2, MC4. In other words, although the data of the DQ line DQ0 and the data of the DQ line bDQ0 have opposite values, single data is expressed by the complementary data ("L", "H") of the DQ line pair DQ0, bDQ0. As a result, the same data is written in the memory cells MC1, MC2, MC3 and MC4.

In the above-described dynamic random access memory of this invention, the memory core using the so-called global DQ line pairs (global data buses) is adopted and thus the number of DQ line pairs (data line pairs) does not excessively increase even if the I/O number increases. Since the global DQ line pairs are arranged on the memory array block (memory cell array), the area of the chip provided with the memory core will not increase due to the global DQ line pairs.

In the dynamic random access memory of this invention, the block-write function is added to the memory core. In the block-write mode, as regards the memory cells which are connected to the selected word line and in which data write is executed, the number of memory cells connected to the DQ line DQi is equal to the number of memory cells connected to the DQ line bDQi. In this case, the same data is simultaneously written to the memory cells connected to the selected word line, and the number of memory cells whose cell capacitors are discharged is equal to the number of memory cells whose cell capacitors are charged. Accordingly, in the block-write mode, fluctuation in potential of the plate electrode shared by the cell capacitors of all memory cells can be prevented.

In the circuits of the above embodiments, the use of the synchronous DRAM which performs read/write operations in synchronism with clock signals is presupposed. However, this invention is applicable to DRAMs which perform read/write operations with use of RAS (Row Address Strobe) signals or CAS (Column Address Strobe) signals. The number of bit line pairs connected to one DQ line pair DQi, bDQi in one memory cell array may be set at $2^n$ (e.g. 4, 8, 16, 32). In addition, the number of memory cells to which the same data is written in the block-write mode (or the number of selected bit line pairs) is not limited, if the above-described conditions are satisfied. In the block-write mode, plural memory cell arrays (or memory array blocks) may be selected, and the same data may be written to plural memory cells in each memory cell array.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A semiconductor memory comprising:
   a first bit line pair comprising a first bit line and a second bit line;
   a first memory cell located at an intersection between a selected word line and the first bit line;
   a second bit line pair comprising a third bit line and a fourth bit line;
   a second memory cell located at an intersection between the selected word line and the fourth bit line;
   a data line pair comprising a first data line and a second data line;
   a first column switch comprising a first transistor connected between the first bit line and the first data line and a second transistor connected between the second bit line and the second data line;
   a second column switch comprising a third transistor connected between the third bit line and the first data line and a fourth transistor connected between the fourth bit line and the second data line;
   an input/output circuit connected to one end of the data line pair; and
   a column decoder, connected to the first and second column switch, for turning on one of the first column switch and the second column switch in a normal-write mode, and turning on both the first column switch and the second column switch in a block-write mode.

2. A semiconductor memory according to claim 1, wherein in the block-write mode, a potential of the first bit line and a potential of the fourth bit line are complementary to each other.

3. A semiconductor memory according to claim 2, wherein the potential of the first bit line is supplied to a cell capacitor of the first memory cell, and the potential of the fourth bit line is supplied to a cell capacitor of the second memory cell.

4. A semiconductor memory according to claim 3, wherein identical data is written to the first memory cell and the second memory cell.

5. A semiconductor memory according to claim 1, further comprising a memory cell array including the first memory cell and the second memory cell, the first column switch being located on one side of the memory cell array, and the second column switch being located on another side opposite to said one side of the memory cell array.

6. A semiconductor memory according to claim 1, wherein the first bit line pair, the second bit line pair and the data line pair extend substantially in one direction.

7. A semiconductor memory according to claim 1, further comprising a first column select line connected between the first column switch and the column decoder and a second column select line connected between the second column switch and the column decoder.

8. A semiconductor memory according to claim 7, wherein the first column select line and the second column select line extend substantially in one direction which is substantially perpendicular to the data line pair.

9. A semiconductor memory according to claim 1, further comprising a first sense amplifier connecting the first bit line pair, and a second sense amplifier connecting the second bit line pair.

10. A semiconductor memory according to claim 9, wherein the semiconductor memory has a shared sense amplifier scheme, a third bit line pair is connected to the first sense amplifier, and a fourth bit line pair is connected to the second sense amplifier.

11. A semiconductor memory according to claim 1, wherein the semiconductor memory has a folded bit line scheme.

12. A semiconductor memory according to claim 1, wherein the semiconductor memory is a dynamic random access memory.

13. A semiconductor memory according to claim 1, wherein the semiconductor memory constitutes a memory core within a memory-embedded LSI.

14. A semiconductor memory comprising:
    a plurality of bit line pairs each comprising a first bit line and a second bit line;
    a plurality of memory cells each located at an intersection between one of the first bit line and the second bit line of each of the bit line pairs and a selected word line;
    a data line pair comprising a first data line and a second data line;
    a plurality of column switches each connected between each of the bit line pairs and the data line pair;
    an input/output circuit connected at one end of the data line pair; and
    a column decoder, connected to the column switches, for turning on one of the column switches in a normal-write mode, and turning on two or more of the column switches in a block-write mode,
    wherein of said memory cells, the number of memory cells connected to the first bit line is equal to the number of memory cells connected to the second bit line.

15. A semiconductor memory according to claim 14, wherein a potential of the first bit line and a potential of the second bit line are complementary to each other.

16. A semiconductor memory according to claim 14, wherein in the block-write mode, the number of memory cells connected to the first bit line, which are among the memory cells connected to the column switches that are turned on, is equal to the number of memory cells connected to the second bit line.

17. A semiconductor memory according to claim 16, wherein in the block-write mode, identical data is written to the memory cells connected to the column switches that are turned on.

18. A semiconductor memory according to claim 14, further comprising a memory cell array including the memory cells, the column switches being located on one side of the memory cell array and on another side opposite to said one side of the memory cell array.

19. A semiconductor memory according to claim 14, wherein the bit line pairs and the data line pair extend substantially in one direction.

20. A semiconductor memory according to claim 14, further comprising column select lines connected between the column switches and the column decoder.

21. A semiconductor memory according to claim 20, wherein the column select lines extend in a direction substantially perpendicular to the data line pair.

22. A semiconductor memory comprising:
- a first bit line pair comprising a first bit line and a second bit line;
- a first memory cell located at an intersection between a first word line and the first bit line;
- a second memory cell located at an intersection between a second word line and the second bit line;
- a second bit line pair comprising a third bit line and a fourth bit line, the second bit line being located between the third bit line and the fourth bit line, the third bit line being located between the first bit line and the second bit line;
- a third memory cell located at an intersection between the second word line and the third bit line;
- a fourth memory cell located at an intersection between the first word line and the fourth bit line;
- a data line pair comprising a first data line and a second data line;
- a first column switch comprising a first transistor connected between the first bit line and the first data line and a second transistor connected between the second bit line and the second data line;
- a second column switch comprising a third transistor connected between the third bit line and the first data line and a fourth transistor connected between the fourth bit line and the second data line;
- an input/output circuit connected to one end of the data line pair; and
- a column decoder connected to the first and second column switch, for turning on one of the first column switch and the second column switch in a normal-write mode, and turning on both the first column switch and the second column switch in a block-write mode.

23. A semiconductor memory according to claim 22, wherein in the block-write mode, a potential of the first bit line and a potential of the fourth bit line are complementary to each other.

24. A semiconductor memory according to claim 23, wherein the potential of the first bit line is supplied to a cell capacitor of the first memory cell, and the potential of the fourth bit line is supplied to a cell capacitor of the fourth memory cell.

25. A semiconductor memory according to claim 24, wherein identical data is written to the first memory cell and the fourth memory cell.

26. A semiconductor memory according to claim 22, further comprising a memory cell array including the first memory cell, the second memory cell, the third memory cell and the fourth memory cell, the first column switch being located on one side of the memory cell array, and the second column switch being located on another side opposite to said one side of the memory cell array.

27. A semiconductor memory according to claim 22, wherein the first bit line pair, the second bit line pair and the data line pair extend substantially in one direction.

28. A semiconductor memory according to claim 22, further comprising a first column select line connected between the first column switch and the column decoder and a second column select line connected between the second column switch and the column decoder.

29. A semiconductor memory according to claim 28, wherein the first column select line and the second column select line extend substantially in one direction which is substantially perpendicular to the data line pair.

30. A semiconductor memory according to claim 22, further comprising a first sense amplifier connecting the first bit line pair, and a second sense amplifier connecting the second bit line pair.

31. A semiconductor memory according to claim 30, wherein the semiconductor memory has a shared sense amplifier scheme, a third bit line pair is connected to the first sense amplifier, and a fourth bit line pair is connected to the second sense amplifier.

32. A semiconductor memory according to claim 22, wherein the semiconductor memory has a fold bit line scheme.

33. A semiconductor memory according to claim 22, wherein the semiconductor memory is a dynamic random access memory.

34. A semiconductor memory according to claim 22, wherein the semiconductor memory constitutes a memory core within a memory-embedded L.I.

* * * * *

UNITED STATES PATENT AND TRADEMARK OFFICE
CERTIFICATE OF CORRECTION

PATENT NO. : 6,154,406
DATED : November 28, 2000
INVENTOR(S) : Shinji Miyano et al.

Page 1 of 1

It is certified that error appears in the above-identified patent and that said Letters Patent is hereby corrected as shown below:

<u>Claim 32, column 18,</u>
Line 42: "fold" has been replaced with the word -- folded --.

Signed and Sealed this

Twenty-fifth Day of September, 2001

*Attest:*

*Nicholas P. Godici*

*Attesting Officer*

NICHOLAS P. GODICI
*Acting Director of the United States Patent and Trademark Office*